US005140596A

United States Patent [19]

Weldon, Jr.

[11] Patent Number: 5,140,596

[45] Date of Patent: Aug. 18, 1992

[54] HIGH SPEED ENCODER FOR NON-SYSTEMATIC CODES

[75] Inventor: Edward J. Weldon, Jr., Honolulu, Hi.

[73] Assignee: Eastman Kodak Company, Rochester, N.Y.

[21] Appl. No.: 481,427

[22] Filed: Feb. 20, 1990

[51] Int. Cl.[5] .............. H03M 13/00

[52] U.S. Cl. .............. 371/39.1; 371/37.5; 371/37.1

[58] Field of Search .............. 371/39.1, 37.1, 37.5, 371/4, 38.1

[56] References Cited

U.S. PATENT DOCUMENTS

| | | | |
|---|---|---|---|
| 4,413,340 | 11/1983 | Odaka et al. | 371/39.1 |
| 4,488,302 | 12/1984 | Ahamed | 371/40.1 |
| 4,606,026 | 8/1986 | Baggen | 371/39.1 |
| 4,646,170 | 2/1987 | Kobayashi et al. | 371/40.1 |
| 4,649,542 | 3/1987 | Nishimura et al. | 371/39.1 |
| 4,677,622 | 6/1987 | Okamoto et al. | 371/39.1 |
| 4,777,635 | 10/1988 | Glover | 371/40 |
| 4,852,099 | 7/1989 | Ozaki | 371/37.5 |
| 4,907,233 | 3/1990 | Deutsch et al. | 371/39.1 |

*Primary Examiner*—Jerry Smith
*Assistant Examiner*—Ly V. Hua
*Attorney, Agent, or Firm*—William W. Holloway; Warren W. Kurz

[57] ABSTRACT

Interleaved cyclic error correction encoded binary data, of the type employed in the compact audio disk standard for example, in which the parity characters are located in the middle of a codeword, are encoded by a serial encoder to greatly increase the speed at which such data may be recorded. In the invention, the message characters are treated as two polynomials, a left-hand sub-codeword or message block representing the message characters to the left of the parity characters and a right-hand sub-codeword or message block representing the message characters to the right of the parity characters. The encoder of the invention has two parallel inputs which simultaneously receive the message characters of the right-hand and left-hand sub-codewords, respectively, each input receiving one character at a time in serial fashion. The enclоder is a serial register in which each stage receives the sum of the contents of the previous stage and (a) the product of the current character of the left-hand sub-codeword multiplied by a respective coefficient of the code generator polynomial and (b) the product of the current character of the left-hand sub-codeword multiplied by a respective coefficient of the residue of an algebraic shift factor, whose degree is equal to the length of the cyclic error correction code minus the length of the sub-codeword, divided by the code generator polynomial.

16 Claims, 6 Drawing Sheets

HIGH SPEED ENCODER FOR NON-SYSTEMATIC CODES

BACKGROUND OF THE INVENTION

1. Technical Field

The invention is related to error correction encoders useful with interleaved data encoded with an outer cyclic error correction code of the type employed, for example, in the compact audio disk industry standard, in which a parallel encoder is typically required because the format is such that the parity characters are in the middle of the codeword.

2. Background Art

In data recording systems, such as the industry standard compact audio disk system, it is necessary to be able to correct not only short random errors in the data but also long bursts of errors occurring therein. A well-known technique is to interleave the data, encode it with an outer error correction code, interleave the outer error correction encoded data, encode the interleaved outer error correction encoded data with an inner error correction code and finally interleave the inner error correction encoded data. Each of the three interleaving steps can perform a different interleaving scheme, as desired. As one example of such a system, the industry standard compact audio disk system employs an outer error correction code in which the check portion, containing the parity characters, is in the middle of the codeword, having message characters on either side of it. The outer code employed is a (28,24) shortened Reed-Solomon code over $GF(2^8)$ in which the first twelve characters in the outer codeword are message characters, the middle four characters are parity characters and the last twelve characters are message characters. The inner code in the compact audio disk standard does not have the check portion in the middle of the inner codeword but rather at the end of the codeword.

The advantage of this system is that, while the encoding process in the recording system is relatively time-consuming, both burst errors and random errors are simply and quickly corrected in the decoder during retrieval or playback of the data, as described in U.S. Pat. No. 4,413,340 to Odaka et al. and assigned to Sony Corporation. This feature minimizes the cost of a compact audio disk player. The referenced Odaka et al. patent describes the inner and outer error correction encoders as well as the interleaving schemes employed at the input and output of each encoder in the industry standard compact audio disk system.

Typically, such systems are intended for use where the speed of recording need not be particularly fast. Such is the case, for example, in the industry standard compact audio disk system in which digital stereo sound is permanently recorded on a master optical disk by a laser beam. The optical pattern thus produced on the master disk is then easily and quickly reproduced on a large number of disks which are then made available to the public. The only requirement is that the decoder in the compact audio disk player keep up with the playback of the data. It does not matter how long the encoder takes to process the data for recording on the master disk. Accordingly, the encoding system described in the above-referenced Odaka et al. patent is not particularly fast. In fact, the speed of the encoder is limited by the nature of the outer code chosen for the industry standard compact audio disk system.

The recording system of the compact audio disk system as described in the above-referenced Odaka et al. patent employs parallel interleavers and parallel encoders which require the simultaneous presence of all characters to be interleaved at each interleaver and to be encoded at each encoder. Thus, the first interleaver must completely interleave all incoming message characters in an incoming data block before the outer encoder can begin encoding to form an outer codeword, and the second interleaver must finish interleaving the outer codeword before the inner encoder can begin encoding the interleaved outer codeword. Thus, there are inherent delays which are unavoidable in a system employing parallel encoders and parallel interleavers. Such delays would not be present in a serial system which serially interleaves and serially encodes the message characters as they are received one character at a time. Such a serial system cannot function using the parallel encoders described above and must instead use serial encoders in place thereof. Unfortunately, the outer parallel Reed Solomon encoder used in the compact audio disk system cannot be replaced by a serial Reed Solomon encoder, because the serial Reed Solomon encoder will not provide the correct parity characters for the outer codeword.

Specifically, since the outer code requires that the check characters of the outer codeword be located in the middle of the word (i.e., in "intermediate" symbol locations in the codeword), it is not possible to encode the data in serial fashion using a conventional byte serial encoder in accordance with the outer code. This is because the value of the parity characters depends in part upon their location within the codeword, and conventional byte-serial encoders can only compute parity characters for placement at the end of the codeword. The degree of the polynomial corresponding to the check characters generated by a serial encoder is lower than the degree of the polynomial representing the message characters, and therefore the check characters generated by a serial encoder correspond to symbol locations at the end of the codeword only. As described, for example, in Peterson, W. W., and E. J. Weldon, Jr., *Error-Correcting Codes*, Ed. II, MIT Press (1972), all of the message characters are shifted through a serial encoder, and when this is done the serial encoder contains the parity characters which are to be appended at the end of all the message characters to form a codeword.

One way around the apparent inability of a serial encoder to compute parity characters having intermediate symbol locations would be to cyclically shift to the left-most symbol locations all of the message characters located in symbol locations to the right of the parity characters, so that the parity characters would be located at the end of the shifted codeword. However, the code is a shortened cyclic code, as mentioned above. Therefore, the resulting shifted codeword would consist, from left to right, of a group of message characters in the left-most symbol locations, a long string of zero-valued characters in intermediate symbol locations and the remaining message characters immediately followed by the parity characters in the right-most symbol locations. The length of the string of zero-valued characters is equal to the size of the code minus the number of message and parity characters in the shortened codeword. Since parity characters in the shifted codeword are located at the end of the codeword, a conventional byte-serial shift register encoder can be used to compute them. Unfortunately, this would not necessarily speed up the encoding process as might be expected because of the extra time wasted as the string of zero-valued characters in the middle of the new codeword is shifted through the serial encoder. (For the reader not familiar with algebraic coding theory, it should be noted that the serial encoder in this case must actually shift all of the zero-valued characters through itself in order to arrive at the right answer, and not simply "skip ahead" past the string of zero-valued characters to the next group of message characters to avoid wasting time.) In the case of the industry standard compact audio disk system, the size of the code is 255 and there are 24 message characters and 4 parity characters, so that the length of the string of zeros in the shifted codeword would be 227. In order to compute the parity characters, the 24 message characters and the 227 zero-valued characters would have to be shifted through the serial encoder, for a total of 251 shifts. The extra 227 shifts (and computations) which must be performed by the serial encoder in such a case would represent an unacceptable delay and is therefore not feasible.

Thus, given the choice of the outer error correction code as a shortened cyclic code having check characters located in intermediate symbol locations, a serial encoder cannot be employed in systems such as the industry standard compact audio disk system. Accordingly, the delays described above which are inherent in a parallel interleaving and encoding system such as the industry standard compact audio disk system appear to be unavoidable. Therefore, it has seemed that there is no practical way to increase the speed at which data can be recorded in a system employing a code in which the parity characters are in intermediate symbol locations.

DISCLOSURE OF THE INVENTION

An error correction system embodying the invention employs an outer code and an inner code in which the message portion of the inner codewords are interleaved codewords of the outer code and in which the parity characters of the outer code are located at intermediate symbol locations and uses byte-serial encoders and byte-serial interleavers exclusively.

A cyclic error correction code serial encoder embodying the invention encodes codewords in accordance with a code whose codewords have their parity characters located in intermediate symbol locations by performing a number of shifts equal to ONE-HALF the number of message characters in the codeword. In the case of the industry standard compact audio disk system, the number of shifts required by the serial encoder of the invention is only 12. This contrasts dramatically with the expectation described above that the number of shifts required would be 251 in such a case. Thus, the encoding speed for this type of system is increased beyond any expectation in the art.

The serial encoder of the invention has successive serial stages each connected to receive results computed in the previous stage by a Galois field adder. The output of the last stage recirculates back to the input of the first stage. Each of two ("left" and "right") serial inputs of the encoder receives one message character at a time from a respective one of the two groups of message characters which are to be located to the left and right, respectively, of the group of parity characters in the codeword. Each message character received at the "left" input is separately multiplied by each of the coefficients of the code generator polynomial and a respective one of the resulting products is individually received at the adder of a corresponding one of the encoder stages. Each message character received at the "right" input of the encoder is separately multiplied by each of the coefficients of a special "shift" polynomial and each one of the resulting products is individually received at the adder of a corresponding one of the encoder stages. The special shift polynomial, h(x), is the remainder of division by the code generator polynomial of the algebraic shift factor $x^n$ otherwise required in the example given previously to shift to the left-most symbol locations the message characters located to the right of the parity characters in the codeword. This may be stated as follows:

$$h(x) = remainder[x^n/g(x)]. \quad (0)$$

In the case of the (28,24) Reed Solomon code of the industry standard compact audio disk system, n=243 and the code generator polynomial in GF($2^8$) is $$g(x) = x^4 + \alpha^{75}x^3 + \alpha^{249}x^2 + \alpha^{78}x + \alpha^6. \quad (1)$$

Therefore, in this exemplary case the special shift polynomial employed in the serial encoder of the invention is $$h(x) = \alpha^{113}x^3 + \alpha^{120}x^2 + \alpha^{246}x + \alpha^{22}. \quad (2)$$

The message characters received at the left input is premultiplied or shifted by a distance equal to the number of parity characters. This is simply accomplished by connecting the left-hand encoder input to the highest order or last stage of the encoder.

The two groups of message characters are sent to the right-hand and left-hand encoder inputs simultaneously one character at a time. As soon as all of the message characters have been shifted through all of the encoder stages, each stage contains one of the parity characters.

BRIEF DESCRIPTION OF THE DRAWINGS

The invention is described in detail below by reference to the accompanying drawings, of which.

MODES FOR CARRYING OUT THE INVENTION

Figure 1A:
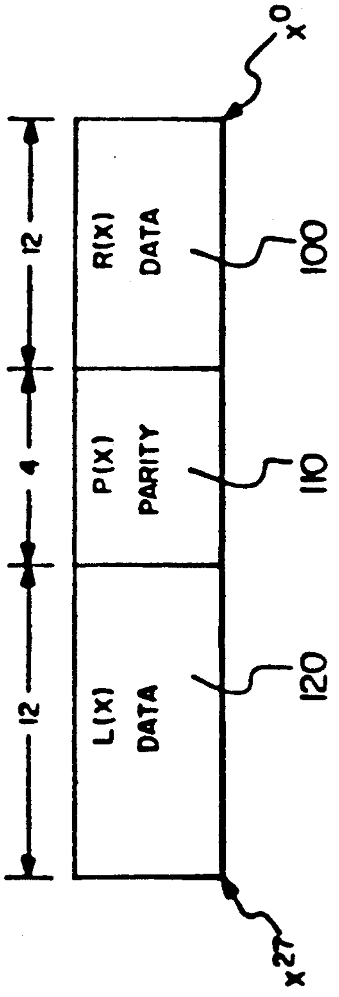
FIG. 1*a* is a diagram of a codeword whose parity check characters are located in the middle of the codeword.

A shortened (28,24) Reed Solomon code over GF($2^8$) has codewords of the form illustrated in FIG. 1*a*. This is the code employed in the industry standard compact disk system. The codeword of FIG. 1*a* is remarkable in that its four parity check characters 110 are located in the middle of the codeword between two groups of twelve message characters 100 and 120, rather than at the right end of the codeword. Each character is a binary eight-bit byte representing one of the elements of $GF(2^8)$. Such a codeword may be thought of as representing a polynomial in which the coefficients of the terms $x^0$ through $x^{11}$ are the first twelve message characters 100, the coefficients of the terms $x^{12}$ through $x^{15}$ are the four parity check characters 110 and the coefficients of the terms $x^{16}$ through $x^{27}$ are the last twelve message characters 120.

As described previously herein, the parity check characters 110 of the codeword cannot be computed by a conventional byte-serial encoder, but instead must be computed using matrix methods which require all of the message characters to be processed together in parallel, in accordance with the referenced patent to Odaka et al. In order to compute the parity check characters, a serial encoder requires that the parity check character locations are the lowest order symbol locations, at the right end of the codeword, corresponding to the coefficients of $x^0$, $x^1$, $x^2$, $x^3$, etc. Such a serial encoder simply divides the polynomial corresponding to the message characters by the code generator polynomial and the remainder of the division contains the parity check characters and has the structure illustrated in FIG. 1*b*.

Figure 1C:
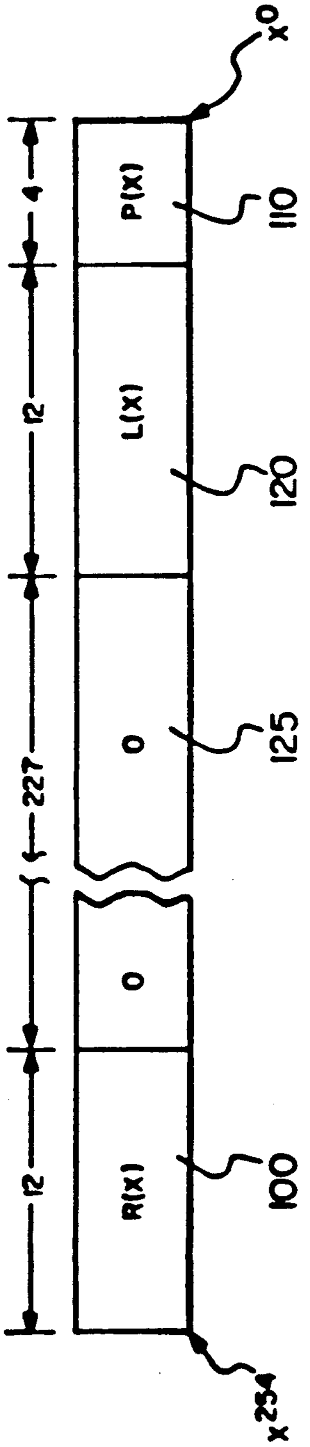
FIG. 1*c* is a diagram of a shifted version of the codeword of FIG. 1*a* in which the parity check characters are located on the right end of the codeword and which can be encoded by the encoder of FIG. 1*b;*
Figure 1B:
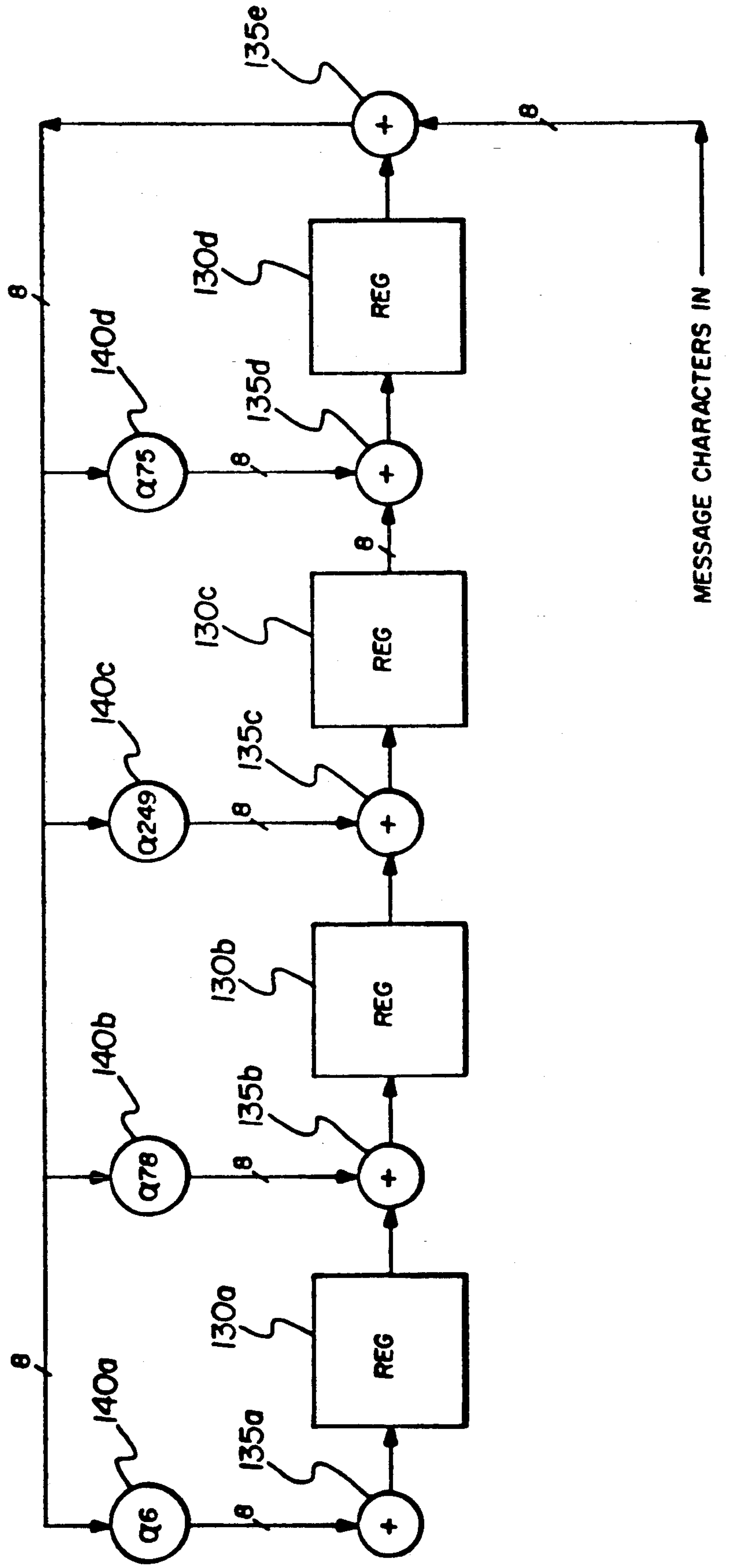
FIG. 1*b* is a diagram of a byte-serial Reed Solomon encoder of the prior art.

Referring to FIG. 1*b*, a serial encoder consists of a series of stages each including a register 130 and a Galois field adder 135, which is an exclusive OR gate. The input to each stage is connected to the output of the previous stage, the output of the last stage being fed back to each of the adders 135 through a respective multiplier 140. Each multiplier 140 multiplies the value fed back from the last stage by a respective one of the coefficients of the code generator polynomial. The encoder of FIG. 1*b* encodes in accordance with the code generator polynomial of Equation (1) above. All of the elements shown in FIG. 1*b* are eight bits wide. Each message character is received one at a time at the adder 135*e*. Each register 130 is strobed in synchronism with the receipt of each new message character at the adder 135*e* to shift the contents of the registers 130 from left to right. In essence, the encoder divides a polynomial whose coefficients are the incoming message characters by the code generator polynomial and stores the coefficients of the remainder (not the quotient) in the registers 130. The quotient is simply discarded. After all of the message characters have been shifted through the encoder of FIG. 1*b*, each of the coefficients stored in the registers 130 is a corresponding one of the parity check characters to be appended to the end of the codeword.

The codeword of FIG. 1*a* can be transformed into a form which is encodable by the encoder of FIG. 1*b*. For this purpose, the message characters 100 to the right of the parity characters 110 are designated as a right-hand polynomial R(x) while the message characters 120 to the left of the parity characters 110 are designated as a left-hand polynomial L(x). Using the RS(28,24) code as an example, if the codeword of FIG. 1*a* is shifted to the right by multiplication of the polynomials corresponding to the characters 100, 110, 120 by an algebraic factor $x^{243}$, the codeword is transformed to the form illustrated in FIG. 1*c*, in which the right-most characters 100 now appear at the left end of the codeword and are separated from the next group of characters 120 by a long string of zero-valued characters 125. The shifted codeword of FIG. 1*c* is a valid codeword because any shift of a codeword of a cyclic code is another codeword. The codeword of FIG. 1*a* corresponds to the codeword polynomial $$C(x)=x^{16}L(x)+x^{12}P(x)+R(x), \tag{3}$$

where P(x) is the polynomial of parity check characters, while the shifted codeword of FIG. 1*c* corresponds to the codeword polynomial $$C'(x)=x^{243}R(x)+x^{4}L(x)+P(x). \tag{4}$$

In essence, R(x) (represented by the twelve message characters 100) consisted of twelve coefficients of $x^0$ through $x^{11}$ in FIG. 1*a* and now, by virtue of being multiplied by $x^{243}$, consists of twelve coefficients of $x^{243}$ through $x^{254}$ in FIG. 1*c*. Of course, the length of the codeword has now been increased from 28 to 255. As a result, while the encoder of FIG. 1*b* can now compute the parity check bytes as the message bytes 120, 125 and 100 are shifted through the encoder in order, an additional 227 shifts of the encoder is required, entailing an unacceptable delay in the encoding process. By way of comparison, it should be noted that if the parity check characters 110 had been located at the right end of the codeword of FIG. 1*a* rather than in the middle, the encoder of FIG. 1*b* could have computed the parity check characters with only twenty-four shifts. An object of the invention is to provide a byte-serial encoder which encodes the codeword of FIG. 1*c* without the extra 227 shifts.

Figure 2:
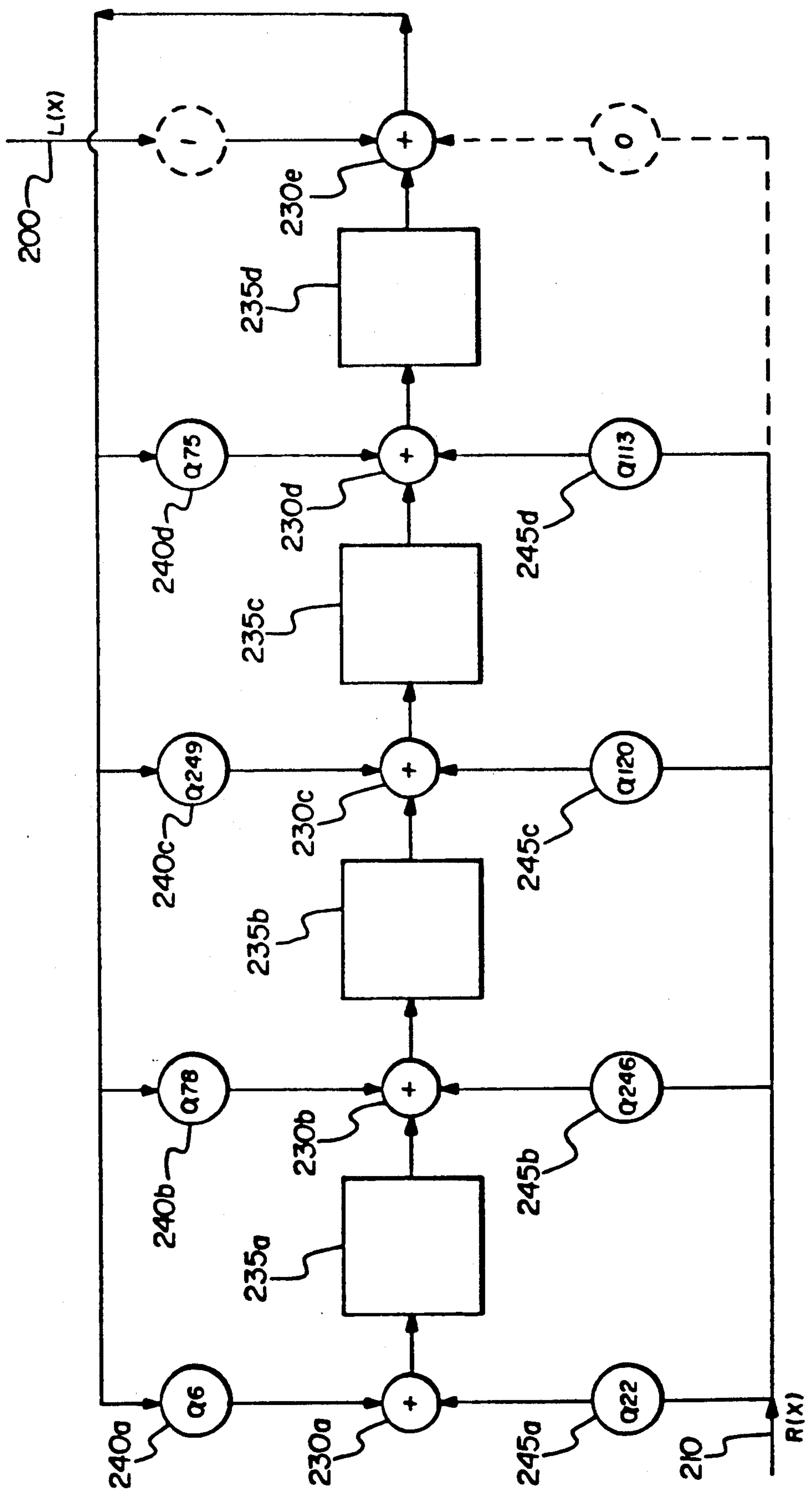
FIG. 2 is a simplified block diagram of a serial Reed Solomon encoder embodying the invention.

The serial encoder of the invention is illustrated in FIG. 2. One input 200 of the encoder of FIG. 2 receives the coefficients of the polynomial L(x) while the other input 210 receives the coefficients of the polynomial R(x). The input 200 is coupled to four serial stages in the manner of the serial encoder of FIG. 1*b*. Each of the stages of the serial encoder of FIG. 2 consists of an eight-bit Galois field adder 230 and an eight-bit register 235. As in FIG. 1*b*, each of the adders 230*a* through 230*d* receives feedback from the last adder 230*e* through a respective multiplier 240 which multiplies the feedback value by a respective one of the code generator polynomial coefficients.

Each coefficient of the right-hand polynomial received at the second encoder input 210 is multiplied in an individual multiplier 245 by a respective one of the coefficients of a special shift polynomial h(x). The special shift polynomial is the remainder of the division by the codeword generator polynomial by the algebraic shift factor which shifted R(x) to the left end of the codeword of FIG. 1*c*. In the specific example discussed above, the algebraic shift factor was $x^{243}$. As discussed above in connection with equations (1) and (2), the special shift polynomial h(x) is given in equation (2). The multipliers 245*a* through 245*d* multiply each character of R(x) by the coefficients of h(x) $\alpha^{22}$, $\alpha^{246}$, $\alpha^{120}$ and $\alpha^{113}$, respectively, as indicated in FIG. 2.

The twelve coefficients of R(x) and the twelve coefficients of L(x) are fed simultaneously to the respective one of the inputs 210, 200 one character at a time. After the encoder of FIG. 2 has been shifted twelve times so that all of the coefficients of R(x) and L(x) have been shifted into the encoder, each of the shift registers 235 contains one of the four parity check characters to be appended to the shifted codeword of FIG. 1c.

It can be shown that the multiplication of R(x) by h(x) replaces the multiplication of R(x) by $x^{243}$ in equation (4). The multiplication of L(x) by $x^4$ in equation (4) is accomplished by simply adding the contents of the highest order stage (the adder 230e) to L(x) (at the input 200) prior to its multiplication by the g(x) multipliers 240a–d of FIG. 2, while R(x) (at the input 210) is coupled directly to the h(x) multipliers 245a–d and thence to the adders 230a–d of the four lowest order stages.

In essence, the encoder of FIG. 2 is a linear feedback register which multiplies R(x) by h(x), multiplies L(x) by $x^4$, divides the sum of the resulting products by the g(x) (the code generator polynomial) and stores the remainder.

The multiplication of R(x) by h(x) can be justified as follows: It has been pointed out in the above-referenced text by Peterson and Weldon at page 368 that in decoding a codeword having a long string of zeros of length s, simplification is achieved by multiplying the received codeword by the remainder of $x^s/g(x)$ prior to decoding. A similar approach can be stated for the encoder of FIG. 2. The shifting of the long string of 227 zeros through the encoder can be dispensed with if right-hand message character polynomial R(x) is multiplied by the remainder of $x^{243}/g(x)$, which is h(x). Multiplication by h(x) is equivalent to multiplication by $x^{243}$ because $$remainder\{x^{243}R(x)/g(x)\} = remainder\}[remainder(x^{243}/g(x))\}/g(x)\}. \qquad (5)$$

However, from the definition of h(x), the expression on the right side of equation (5) is $$remainder\{h(x)\ R(x)/g(x)\}.$$

The product h(x) R(x) is produced at the output of the multipliers 245a–d and the division by g(x) is performed as the output of each multiplier 254 is shifted through the registers 235 in the encoder of FIG. 2.

Conveniently, the number of multipliers 245 required to represent the coefficients of h(x) is the same as the number of multipliers 240 required to represent the coefficients of g(x). This is true not only in the case of the choice of code generator polynomial for the compact audio disk system discussed herein but for any cyclic code whose parity check characters are in intermediate symbol locations. The coefficients of g(x) are preferably normalized so that the leading coefficient (of the highest power of x) is unity, as in equation (1) above. Thus, L(x) at the left input 200 is coupled to the highest order adder 230e through a wire—corresponding to a multiplication by unity. This reduces the number of multipliers 240 required to represent coefficients of g(x) to four, the degree of g(x). The degree of h(x) is always one less than g(x), so that the number of multipliers representing the coefficients of g(x) and h(x) is the same in the preferred embodiment of the invention. In the embodiment FIG. 2, the coefficient of $x^4$ in h(x) is 0. The coefficient of 0 is simply implemented in FIG. 2 by the lack of any connection between the adder 230e corresponding to $x^4$ and R(x) (at the input 210).

SERIAL INTERLEAVING AND ENCODING SYSTEM

The serial encoder of FIG. 2 enables the serial encoding and processing of codewords whose parity characters are in intermediate symbol locations. For example, the interleaving and encoding sub-system of the industry standard compact audio disk recording system can be transformed from the parallel design disclosed in the above-referenced patent to Odaka et al. to a serial byte processing system illustrated in FIG. 3. The serial system of FIG. 3 permits the recording of data at least 9.8 times faster than the parallel system disclosed in the Odaka et al. patent.

Figure 3:
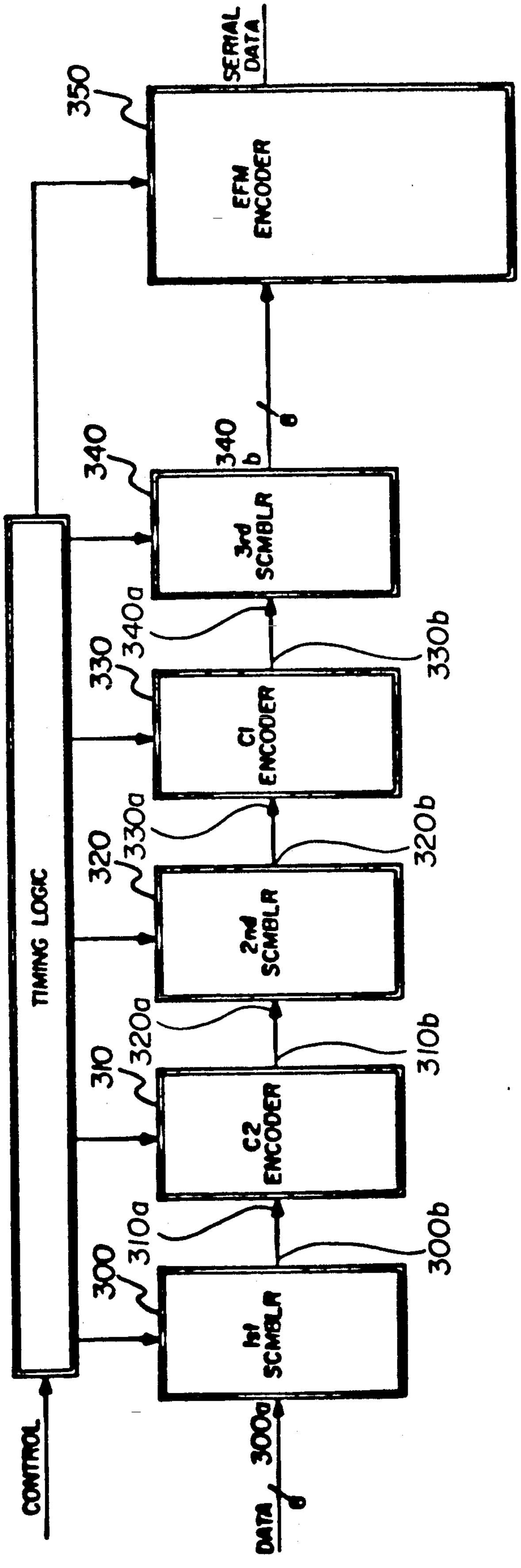
FIG. 3 is a block diagram of an error correction system embodying the invention.

Referring now to FIG. 3, the serial interleaving and encoding system generates data for recording in accordance with the data format described in the Odaka et al. patent and required in the industry standard compact audio disk system. The system includes a first serial interleaver 300 which interleaves incoming user data in accordance with the crossover and delay pattern of the parallel interleaver 1 of FIG. 1A of U.S. Pat. No. 4,413,340 to Odaka et al. However, unlike the parallel interleaver of the Odaka et al. patent, the serial interleaver 300 receives and outputs data one byte at a time. Each block of twenty-four user bytes is received at the input 300a of the serial interleaver 300 of FIG. 3 one byte at a time beginning with the input byte depicted at the top of the left (input) side of the interleaver 1 of FIG. 1A of the Odaka et al. patent and ending with the byte depicted at the bottom thereof. The serial interleaver 300 transmits at its output 300b block of twenty-four interleaved bytes on at a time beginning with the output byte depicted at the top of the right (output) side of the interleaver 1 of FIG. 1A of the Odaka et al. patent and concluding with the byte depicted at the bottom thereof. The structure of the serial interleaver 300 of FIG. 3 will be described below.

An outer serial encoder 310 is the serial encoder of FIG. 2. The serial encoder 310 produces the parity check characters for a codeword of the type illustrated in FIG. 1a. The serial encoder 310 receives from the serial interleaver 300 a block of twenty-four interleaved bytes one byte at a time and passes these bytes along at its output 310a to a second serial interleaver 320. It then transmits the four parity check characters at its output 310a. In the Odaka et al. patent, this function is performed in parallel fashion by the coder 8 of FIG. 1A thereof. The detailed design of the serial encoder 310 for the system of FIG. 3 is described below.

The second serial interleaver 320 interleaves the 28-byte codewords received from the outer serial encoder 310 in accordance with the crossover and delay pattern of the parallel interleaver 9 of FIG. 1B of U.S. Pat. No. 4,413,340 to Odaka et al. However, unlike the parallel interleaver of the Odaka et al. patent, the serial interleaver 320 receives and outputs data one byte at a time. Each codeword of twenty-eight bytes is received at the input 320a of the serial interleaver 320 of FIG. 3 one byte at a time beginning with the input byte depicted at the top of the left (input) side of the interleaver 9 of FIG. 1B of the Odaka et al. patent and ending with the byte depicted at the bottom thereof. The serial interleaver 320 transmits at its output 320b a block of twenty-eight interleaved bytes one at a time beginning with the output byte depicted at the top of the right (output) side of the interleaver 9 of FIG. 1B of the Odaka et al. patent and concluding with the byte depicted at the bottom thereof. The structure of the serial interleaver 320 of FIG. 3 will be described below.

An inner serial encoder 330 receives at its input 330a the interleaved outer codewords from the second serial interleaver 320. The inner serial encoder 330 provides the function performed in parallel fashion by the coder 10 of FIG. 1B of U.S. Pat. No. 4,413,340 to Odaka et al. This function is to encode each incoming 28-byte block in accordance with a systematic code in which the parity check characters are located at the end of the codeword. A conventional serial encoder suffices to perform this function, as there are no parity characters in intermediate symbol locations in such a systemic code. Accordingly, in the serial encoding system of FIG. 3, the serial encoder 330 is a conventional Reed-Solomon serial encoder of the type well-known in the prior art and which is described for example in the above-referenced text by W. W. Peterson and E. J. Weldon, Jr. The conventional serial encoder 330 employs the Reed-Solomon code described in connection with the coder 10 of FIG. 1B of the above-referenced patent to Odaka et al. The twenty-eight bytes of each block to be encoded are received one at a time at the input 330*a* of the serial encoder 330. They are transmitted at the encoder output 330*b*, followed immediately by four parity check characters computed by the serial encoder 330, one byte at a time.

A third serial interleaver 340 interleaves the 32-byte codewords received from the inner serial encoder 330 in accordance with the crossover and delay pattern of the parallel interleaver 11 of FIG. 1B of U.S. Pat. No. 4,413,340 to Odaka et al. However, unlike the parallel interleaver of the Odaka et al. patent, the serial interleaver 340 receives and outputs data one byte at a time. Each codeword of thirty-two bytes is received at the input 340*a* of the serial interleaver 340 of FIG. 3 one byte at a time beginning with the input byte depicted at the top of the left (input) side of the interleaver 11 of FIG. 1B of the Odaka et al. patent and ending with the byte depicted at the bottom thereof. The serial interleaver 340 transmits at its output 340*b* a block of thirty-two interleaved bytes one byte at a time beginning with the output byte depicted at the top of the right (output) side of the interleaver 11 of FIG. 1B of the Odaka et al. patent and concluding with the byte depicted at the bottom thereof. The structure of the serial interleaver 340 of FIG. 3 will be described below.

The output 340*b* of the third serial interleaver is connected to an 8-to-14 bit channel encoder 350, which produces data processed by recording circuits not shown in FIG. 3.

Figure 4:
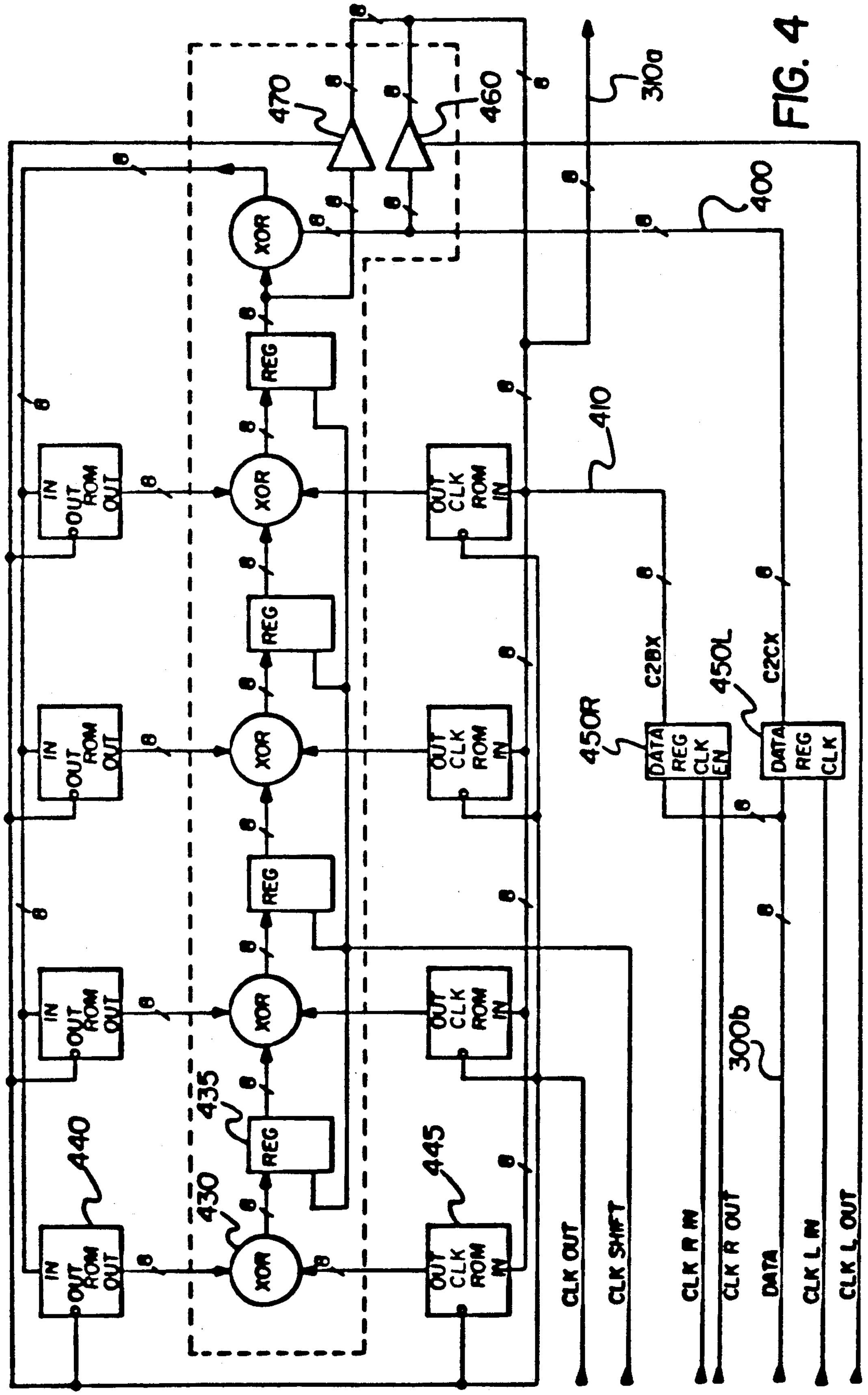
FIG. 4 is a block of the encoder of FIG. 2 as employed in the system of FIG. 3.

The preferred embodiment of the two-input outer serial encoder 310 is illustrated in FIG. 4. It is an implementation of the generic two-input encoder illustrated in FIG. 2. All data lines are eight bit wide, as noted in FIG. 4, while all control and clocking lines are one bit wide. Each adder 230 of FIG. 2 is implemented by an 8-bit exclusive OR gate 430 in FIG. 4. Each register 235 of FIG. 2 is implemented by an 8-bit flip-flop register 435 in FIG. 4. Each multiplier 240 of FIG. 2 is implemented by a read-only memory (ROM) 440 in FIG. 4 whose 8-bit address input is the multiplier input and whose 8-bit data output is the multiplier output. Each ROM 440 is programmed in the well-known manner such that the 8-bit data output is the Galois field product of the eight bit input with the corresponding coefficient of the code generator polynomial g(x). Each multiplier 245 of FIG. 2 is implemented by a read-only memory (ROM) 445 in FIG. 4 whose 8-bit address input is the multiplier input and whose 8-bit data output is the multiplier output. Each ROM 445 is programmed in the well-known manner such that the 8-bit data output is the Galois field product of the 8-bit input with the corresponding coefficient of the special shift polynomial h(x).

Alternate ones of the incoming bytes from the first serial interleaver output 300*b* are treated as the coefficients of the left-hand message polynomial L(x) while the remaining ones are treated as the coefficients of the right-hand message polynomial R(x). For this purpose, the first interleaver output 300*b* (which constitutes the input to the encoder of FIG. 4) is connected to two input registers 450R and 450L, which control the incoming bytes associated with the polynomials R(x) and L(x), respectively. The incoming bytes are stored alternately in the input registers 450L and 450R in synchronism with clock signals CLK L IN and CLK R IN, respectively. After each byte of L(x) is received in the input register 450L, it is applied to the "left" encoder input 400 connected to the highest order adder 430*e*. It is also applied through an eight-bit tristate buffer 460 to the encoder output (connected to the second interleaver input 310) in synchronism with a clock signal CLK L OUT. Similarly, after each byte of R(x) is received in the input register 450R, it is applied to the "right" encoder input 410 as well as the encoder output by the register 450R in synchronism with a clock signal CLK R OUT. The left encoder input 400 is connected to the inputs of the g(x) multiplier ROM's 440 while the right encoder input is connected to the inputs cf the h(x) multiplier ROM's 445. As soon as an L(x) byte has been sent to the left input 400 and an R(x) byte has been sent to the right input 410, all of the registers 435*a–d* are clocked once so as to shift bytes through the encoder left-to-right by one stage in synchronism with a clock signal CLK SHIFT. The foregoing operation is repeated twelve times (in the case of the Reed-Solomon (28,24) code discussed above in connection with FIG. 1*a*) so that all of the L(x) and R(x) bytes are shifted into the encoder of FIG. 4. Then, outputs of all of the multiplier ROM's 440 and 445 are disabled by a clock signal CLK OUT so that no multiplication takes place in the encoder and the contents of the registers 435*a–d* are shifted left-to-right in synchronism with the clock signal CLK SHIFT through a tri-state output buffer 470 to the encoder output. The tri-state encoder output buffer is enabled for this purpose by the clock signal CLK OUT.

The portion of the encoder of FIG. 4 which is enclosed in dashed line including the adders 430, the registers 435 and the tri-state output buffers 460 and 470, was implemented in a programmable logic array PAL 16R4A-4CNSTD in accordance with standard practice.

Figure 5:
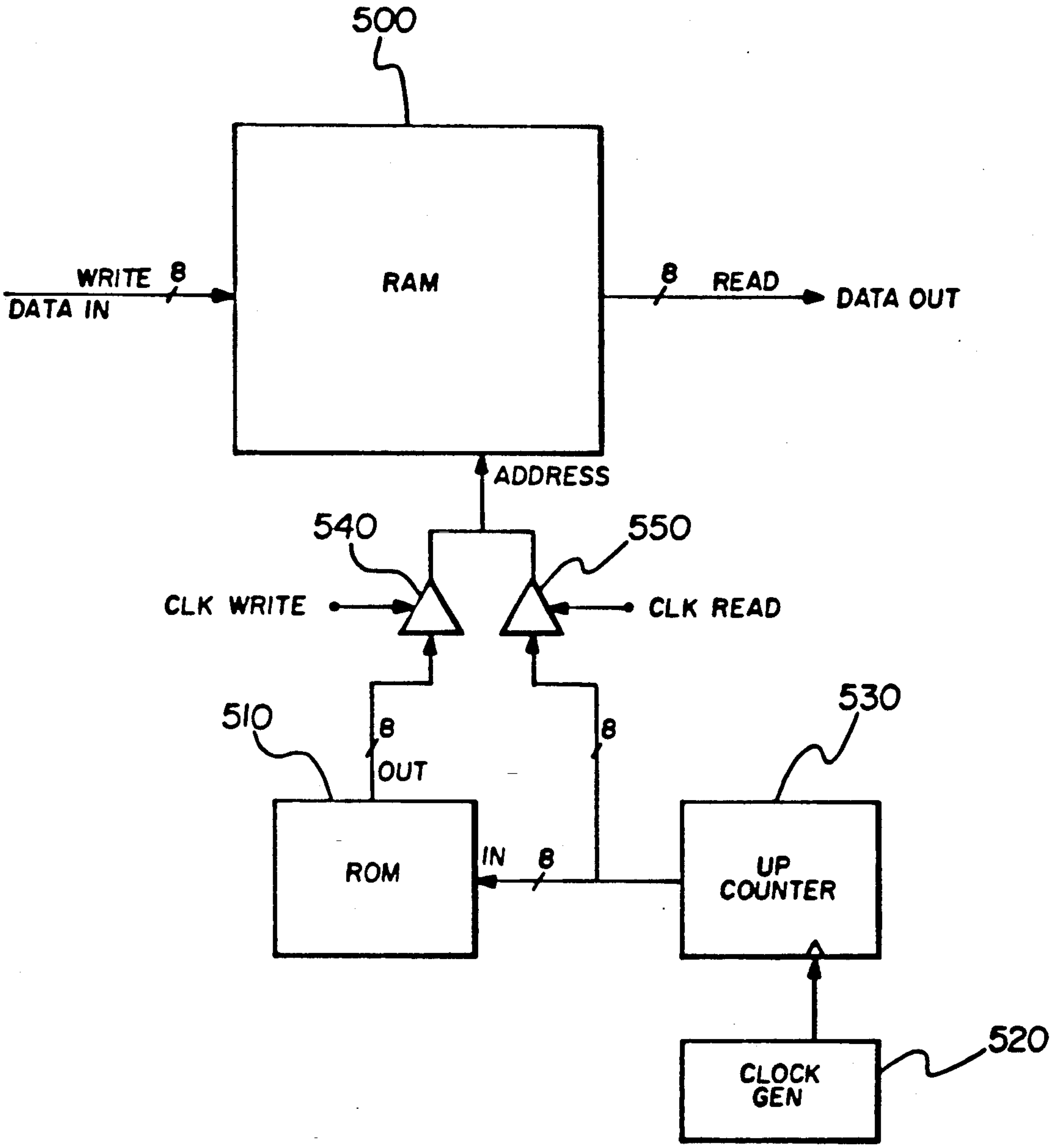
FIG. 5 is a simplified block diagram of a typical scrambling element employed in each interleaver in the system of FIG. 3.

Each of the serial interleavers was implemented using a generic structure corresponding to that illustrated in FIG. 5. The interleaving is accomplished by temporarily storing the incoming bytes in individual memory locations in a random access memory (RAM) 500 in a first order and then reading them out in a second order which is scrambled in a predetermined manner with respect to the first order. The scrambling is defined in accordance with the respective interleaving schemes discussed previously herein and illustrated in the above-referenced Odaka et al. patent, by programming a ROM 510 connected to the address input 500*a* of the RAM 500. A clock generator 520 with which the bytes are synchronized drives an 8-bit up-counter 530 whose output is connected to the address input of the ROM 510. As bytes are received at the interleaver, the up-counter 530 sends a sequence of monotonically increasing count bytes to the ROM 510 as it counts up in synchronism with the clock generator 520. Each count byte stimulates the ROM 510 to send a unique address byte to the RAM 500 specifying a unique address for writing the current incoming data byte. The progression of address bytes generated by the ROM 510 is defined differently for each of the serial interleavers 300, 320 and 340 and is scrambled with respect to the monotonic progression of count bytes generated by the up-counter 530. After all of the bytes of the current block have been written into the RAM 500, control of the RAM's address input is taken over by the up-counter 530, and the bytes are read out of the RAM 500 in a monotonically increasing order of memory addresses. For this purpose, the RAM address input is connected to the outputs of the ROM 510 and the up-counter 530 through 8-bit gates 540 and 550 respectively. The gates 540 and 550 are controlled by clock signals CLK WRITE and CLK READ, respectively, which are respectively enabling during the writing and the reading of the data in the RAM 500.

The first interleaver 300 of FIG. 3 was implemented with a version of the structure of FIG. 5 in which the ROM 510 is programmed in accordance with the table of Appendix A. For each address byte generated by the ROM 510, Appendix A lists a set of counts received from the up-counter 530 which stimulate transmission of that address byte. The second interleaver 320 of FIG. 3 was implemented with a version of the structure of FIG. 5 in which the ROM 510 is programmed in accordance with the table of Appendix B. For each address byte transmitted by the ROM 510, Appendix B lists a set of counts received from the up-counter 530 which stimulate transmission of that address byte. The third interleaver 340 was implemented with a version of the structure of FIG. 5 in which the ROM 510 was programmed in accordance with the table of Appendix C. For each address byte transmitted by the ROM 510, Appendix C lists a set of counts received from the up-counter which stimulate transmission of that address byte.

While the invention has been described in connection with a non-systemic RS(28,24) code having parity character symbol locations in the middle of the codeword, other embodiments are useful with trivial modifications with other non-systematic codes whose parity characters have various intermediate symbol locations.

While the invention has been described in detail by specific reference to preferred embodiments thereof, it is understood that variations and modifications thereof may be made without departing from the true spirit and scope of the invention.

*APPENDIX A*

COPYRIGHT 1990 Eastman Kodak Company

```
[illegible]
5F 5E 5D 5C 5B 5A 59 58 [illegible] 56 55 54 53 52 51 50
4F 4E 4D 4C 4B 4A 49 48 [illegible] 46 45 44 43 42 41 40
3F 3E 3D 3C 3B 3A 39 38 37 36 35 34 33 32 31 30
2F 2E 2D 2C 2B 2A 29 28 27 26 25 24 23 22 21 20
1F 1E 1D 1C 1B 1A 19 18 17 16 15 14 13 12 11 10
0F 0E 0D 0C 0B 0A 09 08 07 06 05 04 03 02 01 00
00 00 00 00 00 00 00 00 00 00 00 00 00 00 00 00
00 00 00 00 00 00 00 00 00 00 00 00 00 00 00 00

$A0080,
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00

$A0100,
17 15 0B 09 46 44 3A 38 13 11 07 05 42 40 36 34
2F 0D 03 01 3E 3C 32 30 5F 5D 53 51 2E 2C 22 20
5B 59 4F 4D 2A 28 1E 1C 57 55 4B 49 26 24 1A 18
47 45 3B 39 16 14 0A 08 43 41 37 35 12 10 06 04
3F 3D 33 31 0E 0C 02 00 2F 2D 23 21 5E 5C 52 50
2B 29 1F 1D 5A 58 4E 4C 27 25 1B 19 56 54 4A 48
00 00 00 00 00 00 00 00 00 00 00 00 00 00 00 00
00 00 00 00 00 00 00 00 00 00 00 00 00 00 00 00

$A0180,
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
 $E23AC,
```

APPENDIX B

COPYRIGHT 1990 Eastman Kodak Company

```
0BF7 0BF6 0BF5 0BF4      F3 0BF2 0BF1 0BF0 0BEF 0BEE 0BE    EC 0BEB 0BEA 0BE9 0BE8
0BE7 0BE6 0BE5 0BE4 .BE3 0BE2 0BE1 0BE0 0BDF 0BDE 0BDD .BDC 0BDB 0BDA 0BD9 0BD8
0BD7 0BD6 0BD5 0BD4 0BD3 0BD2 0BD1 0BD0 0BCF 0BCE 0BCD 0BCC 0BCB 0BCA 0BC9 0BC8
0BC7 0BC6 0BC5 0BC4 0BC3 0BC2 0BC1 0BC0 0BBF 0BBE 0BBD 0BBC 0BBB 0BBA 0BB9 0BB8
0BB7 0BB6 0BB5 0BB4 0BB3 0BB2 0BB1 0BB0 0BAF 0BAE 0BAD 0BAC 0BAB 0BAA 0BA9 0BA8
0BA7 0BA6 0BA5 0BA4 0BA3 0BA2 0BA1 0BA0 0B9F 0B9E 0B9D 0B9C 0B9B 0B9A 0B99 0B98
0B97 0B96 0B95 0B94 0B93 0B92 0B91 0B90 0B8F 0B8E 0B8D 0B8C 0B8B 0B8A 0B89 0B88

$A0080,
0B87 0B86 0B85 0B84 0B83 0B82 0B81 0B80 0B7F 0B7E 0B7D 0B7C 0B7B 0B7A 0B79 0B78
0B77 0B76 0B75 0B74 0B73 0B72 0B71 0B70 0B6F 0B6E 0B6D 0B6C 0B6B 0B6A 0B69 0B68
0B67 0B66 0B65 0B64 0B63 0B62 0B61 0B60 0B5F 0B5E 0B5D 0B5C 0B5B 0B5A 0B59 0B58
0B57 0B56 0B55 0B54 0B53 0B52 0B51 0B50 0B4F 0B4E 0B4D 0B4C 0B4B 0B4A 0B49 0B48
0B47 0B46 0B45 0B44 0B43 0B42 0B41 0B40 0B3F 0B3E 0B3D 0B3C 0B3B 0B3A 0B39 0B38
0B37 0B36 0B35 0B34 0B33 0B32 0B31 0B30 0B2F 0B2E 0B2D 0B2C 0B2B 0B2A 0B29 0B28
0B27 0B26 0B25 0B24 0B23 0B22 0B21 0B20 0B1F 0B1E 0B1D 0B1C 0B1B 0B1A 0B19 0B18
0B17 0B16 0B15 0B14 0B13 0B12 0B11 0B10 0B0F 0B0E 0B0D 0B0C 0B0B 0B0A 0B09 0B08

$A0100,
0B07 0B06 0B05 0B04 0B03 0B02 0B01 0B00 0AFF 0AFE 0AFD 0AFC 0AFB 0AFA 0AF9 0AF8
0AF7 0AF6 0AF5 0AF4 0AF3 0AF2 0AF1 0AF0 0AEF 0AEE 0AED 0AEC 0AEB 0AEA 0AE9 0AE8
0AE7 0AE6 0AE5 0AE4 0AE3 0AE2 0AE1 0AE0 0ADF 0ADE 0ADD 0ADC 0ADB 0ADA 0AD9 0AD8
0AD7 0AD6 0AD5 0AD4 0AD3 0AD2 0AD1 0AD0 0ACF 0ACE 0ACD 0ACC 0ACB 0ACA 0AC9 0AC8
0AC7 0AC6 0AC5 0AC4 0AC3 0AC2 0AC1 0AC0 0ABF 0ABE 0ABD 0ABC 0ABB 0ABA 0AB9 0AB8
0AB7 0AB6 0AB5 0AB4 0AB3 0AB2 0AB1 0AB0 0AAF 0AAE 0AAD 0AAC 0AAB 0AAA 0AA9 0AA8
0AA7 0AA6 0AA5 0AA4 0AA3 0AA2 0AA1 0AA0 0A9F 0A9E 0A9D 0A9C 0A9B 0A9A 0A99 0A98
0A97 0A96 0A95 0A94 0A93 0A92 0A91 0A90 0A8F 0A8E 0A8D 0A8C 0A8B 0A8A 0A89 0A88

$A0180,
0A87 0A86 0A85 0A84 0A83 0A82 0A81 0A80 0A7F 0A7E 0A7D 0A7C 0A7B 0A7A 0A79 0A78
0A77 0A76 0A75 0A74 0A73 0A72 0A71 0A70 0A6F 0A6E 0A6D 0A6C 0A6B 0A6A 0A69 0A68
0A67 0A66 0A65 0A64 0A63 0A62 0A61 0A60 0A5F 0A5E 0A5D 0A5C 0A5B 0A5A 0A59 0A58
0A57 0A56 0A55 0A54 0A53 0A52 0A51 0A50 0A4F 0A4E 0A4D 0A4C 0A4B 0A4A 0A49 0A48
0A47 0A46 0A45 0A44 0A43 0A42 0A41 0A40 0A3F 0A3E 0A3D 0A3C 0A3B 0A3A 0A39 0A38
0A37 0A36 0A35 0A34 0A33 0A32 0A31 0A30 0A2F 0A2E 0A2D 0A2C 0A2B 0A2A 0A29 0A28
0A27 0A26 0A25 0A24 0A23 0A22 0A21 0A20 0A1F 0A1E 0A1D 0A1C 0A1B 0A1A 0A19 0A18
0A17 0A16 0A15 0A14 0A13 0A12 0A11 0A10 0A0F 0A0E 0A0D 0A0C 0A0B 0A0A 0A09 0A08

$A0200,
0A07 0A06 0A05 0A04 0A03 0A02 0A01 0A00 09FF 09FE 09FD 09FC 09FB 09FA 09F9 09F8
09F7 09F6 09F5 09F4 09F3 09F2 09F1 09F0 09EF 09EE 09ED 09EC 09EB 09EA 09E9 09E8
09E7 09E6 09E5 09E4 09E3 09E2 09E1 09E0 09DF 09DE 09DD 09DC 09DB 09DA 09D9 09D8
09D7 09D6 09D5 09D4 09D3 09D2 09D1 09D0 09CF 09CE 09CD 09CC 09CB 09CA 09C9 09C8
09C7 09C6 09C5 09C4 09C3 09C2 09C1 09C0 09BF 09BE 09BD 09BC 09BB 09BA 09B9 09B8
09B7 09B6 09B5 09B4 09B3 09B2 09B1 09B0 09AF 09AE 09AD 09AC 09AB 09AA 09A9 09A8
09A7 09A6 09A5 09A4 09A3 09A2 09A1 09A0 099F 099E 099D 099C 099B 099A 0999 0998
0997 0996 0995 0994 0993 0992 0991 0990 098F 098E 098D 098C 098B 098A 0989 0988

$A0280,
0987 0986 0985 0984 0983 0982 0981 0980 097F 097E 097D 097C 097B 097A 0979 0978
0977 0976 0975 0974 0973 0972 0971 0970 096F 096E 096D 096C 096B 096A 0969 0968
0967 0966 0965 0964 0963 0962 0961 0960 095F 095E 095D 095C 095B 095A 0959 0958
0957 0956 0955 0954 0953 0952 0951 0950 094F 094E 094D 094C 094B 094A 0949 0948
0947 0946 0945 0944 0943 0942 0941 0940 093F 093E 093D 093C 093B 093A 0939 0938
0937 0936 0935 0934 0933 0932 0931 0930 092F 092E 092D 092C 092B 092A 0929 0928
0927 0926 0925 0924 0923 0922 0921 0920 091F 091E 091D 091C 091B 091A 0919 0918
0917 0916 0915 0914 0913 0912 0911 0910 090F 090E 090D 090C 090B 090A 0909 0908

$A0300,
0907 0906 0905 0904 0903 0902 0901 0900 08FF 08FE 08FD 08FC 08FB 08FA 08F9 08F8
08F7 08F6 08F5 08F4 08F3 08F2 08F1 08F0 08EF 08EE 08ED 08EC 08EB 08EA 08E9 08E8
08E7 08E6 08E5 08E4 08E3 08E2 08E1 08E0 08DF 08DE 08DD 08DC 08DB 08DA 08D9 08D8
08D7 08D6 08D5 08D4 08D3 08D2 08D1 08D0 08CF 08CE 08CD 08CC 08CB 08CA 08C9 08C8
08C7 08C6 08C5 08C4 08C3 08C2 08C1 08C0 08BF 08BE 08BD 08BC 08BB 08BA 08B9 08B8
08B7 08B6 08B5 08B4 08B3 08B2 08B1 08B0 08AF 08AE 08AD 08AC 08AB 08AA 08A9 08A8
08A7 08A6 08A5 08A4 08A3 08A2 08A1 08A0 089F 089E 089D 089C 089B 089A 0899 0898
0897 0896 0895 0894 0893 0892 0891 0890 088F 088E 088D 088C 088B 088A 0889 0888
0887 0886 0885 0884    3 0882 0881 0880 087F 087E 087D    C 087B 087A 0879 0878
0877 0876 0875 0874 .  3 0872 0871 0870 086F 086E 086D   .C 086B 086A 0869 0868
0867 0866 0865 0864 0863 0862 0861 0860 085F 085E 085D 085C 085B 085A 0859 0858
```

```
0857 0856 0855 0854 0853 0852 0851 0850 084F 084E 084D 084C 084B 084A 0849 0848
0847 0846 0845 0844 0843 0842 0841 0840 083F 083E 083D 083C 083B 083A 0839 0838
0837 0836 0835 0834 0833 0832 0831 0830 082F 082E 082D 082C 082B 082A 0829 0828
0827 0826 0825 0824 0823 0822 0821 0820 081F 081E 081D 081C 081B 081A 0819 0818
0817 0816 0815 0814 0813 0812 0811 0810 080F 080E 080D 080C 080B 080A 0809 0808

$A0400,
0807 0806 0805 0804 0803 0802 0801 0800 07FF 07FE 07FD 07FC 07FB 07FA 07F9 07F8
07F7 07F6 07F5 07F4 07F3 07F2 07F1 07F0 07EF 07EE 07ED 07EC 07EB 07EA 07E9 07E8
07E7 07E6 07E5 07E4 07E3 07E2 07E1 07E0 07DF 07DE 07DD 07DC 07DB 07DA 07D9 07D8
07D7 07D6 07D5 07D4 07D3 07D2 07D1 07D0 07CF 07CE 07CD 07CC 07CB 07CA 07C9 07C8
07C7 07C6 07C5 07C4 07C3 07C2 07C1 07C0 07BF 07BE 07BD 07BC 07BB 07BA 07B9 07B8
07B7 07B6 07B5 07B4 07B3 07B2 07B1 07B0 07AF 07AE 07AD 07AC 07AB 07AA 07A9 07A8
07A7 07A6 07A5 07A4 07A3 07A2 07A1 07A0 079F 079E 079D 079C 079B 079A 0799 0798
0797 0796 0795 0794 0793 0792 0791 0790 078F 078E 078D 078C 078B 078A 0789 0788

$A0480,
0787 0786 0785 0784 0783 0782 0781 0780 077F 077E 077D 077C 077B 077A 0779 0778
0777 0776 0775 0774 0773 0772 0771 0770 076F 076E 076D 076C 076B 076A 0769 0768
0767 0766 0765 0764 0763 0762 0761 0760 075F 075E 075D 075C 075B 075A 0759 0758
0757 0756 0755 0754 0753 0752 0751 0750 074F 074E 074D 074C 074B 074A 0749 0748
0747 0746 0745 0744 0743 0742 0741 0740 073F 073E 073D 073C 073B 073A 0739 0738
0737 0736 0735 0734 0733 0732 0731 0730 072F 072E 072D 072C 072B 072A 0729 0728
0727 0726 0725 0724 0723 0722 0721 0720 071F 071E 071D 071C 071B 071A 0719 0718
0717 0716 0715 0714 0713 0712 0711 0710 070F 070E 070D 070C 070B 070A 0709 0708

$A0500,
0707 0706 0705 0704 0703 0702 0701 0700 06FF 06FE 06FD 06FC 06FB 06FA 06F9 06F8
06F7 06F6 06F5 06F4 06F3 06F2 06F1 06F0 06EF 06EE 06ED 06EC 06EB 06EA 06E9 06E8
06E7 06E6 06E5 06E4 06E3 06E2 06E1 06E0 06DF 06DE 06DD 06DC 06DB 06DA 06D9 06D8
06D7 06D6 06D5 06D4 06D3 06D2 06D1 06D0 06CF 06CE 06CD 06CC 06CB 06CA 06C9 06C8
06C7 06C6 06C5 06C4 06C3 06C2 06C1 06C0 06BF 06BE 06BD 06BC 06BB 06BA 06B9 06B8
06B7 06B6 06B5 06B4 06B3 06B2 06B1 06B0 06AF 06AE 06AD 06AC 06AB 06AA 06A9 06A8
06A7 06A6 06A5 06A4 06A3 06A2 06A1 06A0 069F 069E 069D 069C 069B 069A 0699 0698
0697 0696 0695 0694 0693 0692 0691 0690 068F 068E 068D 068C 068B 068A 0689 0688

$A0580,
0687 0686 0685 0684 0683 0682 0681 0680 067F 067E 067D 067C 067B 067A 0679 0678
0677 0676 0675 0674 0673 0672 0671 0670 066F 066E 066D 066C 066B 066A 0669 0668
0667 0666 0665 0664 0663 0662 0661 0660 065F 065E 065D 065C 065B 065A 0659 0658
0657 0656 0655 0654 0653 0652 0651 0650 064F 064E 064D 064C 064B 064A 0649 0648
0647 0646 0645 0644 0643 0642 0641 0640 063F 063E 063D 063C 063B 063A 0639 0638
0637 0636 0635 0634 0633 0632 0631 0630 062F 062E 062D 062C 062B 062A 0629 0628
0627 0626 0625 0624 0623 0622 0621 0620 061F 061E 061D 061C 061B 061A 0619 0618
0617 0616 0615 0614 0613 0612 0611 0610 060F 060E 060D 060C 060B 060A 0609 0608

$A0600,
0607 0606 0605 0604 0603 0602 0601 0600 05FF 05FE 05FD 05FC 05FB 05FA 05F9 05F8
05F7 05F6 05F5 05F4 05F3 05F2 05F1 05F0 05EF 05EE 05ED 05EC 05EB 05EA 05E9 05E8
05E7 05E6 05E5 05E4 05E3 05E2 05E1 05E0 05DF 05DE 05DD 05DC 05DB 05DA 05D9 05D8
05D7 05D6 05D5 05D4 05D3 05D2 05D1 05D0 05CF 05CE 05CD 05CC 05CB 05CA 05C9 05C8
05C7 05C6 05C5 05C4 05C3 05C2 05C1 05C0 05BF 05BE 05BD 05BC 05BB 05BA 05B9 05B8
05B7 05B6 05B5 05B4 05B3 05B2 05B1 05B0 05AF 05AE 05AD 05AC 05AB 05AA 05A9 05A8
05A7 05A6 05A5 05A4 05A3 05A2 05A1 05A0 059F 059E 059D 059C 059B 059A 0599 0598
0597 0596 0595 0594 0593 0592 0591 0590 058F 058E 058D 058C 058B 058A 0589 0588

$A0680,
0587 0586 0585 0584 0583 0582 0581 0580 057F 057E 057D 057C 057B 057A 0579 0578
0577 0576 0575 0574 0573 0572 0571 0570 056F 056E 056D 056C 056B 056A 0569 0568
0567 0566 0565 0564 0563 0562 0561 0560 055F 055E 055D 055C 055B 055A 0559 0558
0557 0556 0555 0554 0553 0552 0551 0550 054F 054E 054D 054C 054B 054A 0549 0548
0547 0546 0545 0544 0543 0542 0541 0540 053F 053E 053D 053C 053B 053A 0539 0538
0537 0536 0535 0534 0533 0532 0531 0530 052F 052E 052D 052C 052B 052A 0529 0528
0527 0526 0525 0524 0523 0522 0521 0520 051F 051E 051D 051C 051B 051A 0519 0518
0517 0516 0515 0514 0513 0512 0511 0510 050F 050E 050D 050C 050B 050A 0509 0508
0507 0506 0505 0504 [illegible] 0502 0501 0500 [illegible]
04F7 04F6 04F5 04F4 [illegible] 04F2 04F1 04F0 04EF 04EE 04ED [illegible] 04EB 04EA 04E9 04E8
04E7 04E6 04E5 04E4 [illegible] 04E2 04E1 04E0 04DF 04DE 04DD [illegible] 04DB 04DA 04D9 04D8
04D7 04D6 04D5 04D4 04D3 04D2 04D1 04D0 04CF 04CE 04CD 04CC 04CB 04CA 04C9 04C8
04C7 04C6 04C5 04C4 04C3 04C2 04C1 04C0 04BF 04BE 04BD 04BC 04BB 04BA 04B9 04B8
04B7 04B6 04B5 04B4 04B3 04B2 04B1 04B0 04AF 04AE 04AD 04AC 04AB 04AA 04A9 04A8
04A7 04A6 04A5 04A4 04A3 04A2 04A1 04A0 049F 049E 049D 049C 049B 049A 0499 0498
0497 0496 0495 0494 0493 0492 0491 0490 048F 048E 048D 048C 048B 048A 0489 0488

$A0780,
0487 0486 0485 0484 0483 0482 0481 0480 047F 047E 047D 047C 047B 047A 0479 0478
```

0477 0476 0475 0474 0473 0472 0471 0470 046F 046E 046D 046C 046B 046A 0469 0468
0467 0466 0465 0464 0463 0462 0461 0460 045F 045E 045D 045C 045B 045A 0459 0458
0457 0456 0455 0454 0453 0452 0451 0450 044F 044E 044D 044C 044B 044A 0449 0448
0447 0446 0445 0444 0443 0442 0441 0440 043F 043E 043D 043C 043B 043A 0439 0438
0437 0436 0435 0434 0433 0432 0431 0430 042F 042E 042D 042C 042B 042A 0429 0428
0427 0426 0425 0424 0423 0422 0421 0420 041F 041E 041D 041C 041B 041A 0419 0418
0417 0416 0415 0414 0413 0412 0411 0410 040F 040E 040D 040C 040B 040A 0409 0408

$A0800,
0407 0406 0405 0404 0403 0402 0401 0400 03FF 03FE 03FD 03FC 03FB 03FA 03F9 03F8
03F7 03F6 03F5 03F4 03F3 03F2 03F1 03F0 03EF 03EE 03ED 03EC 03EB 03EA 03E9 03E8
03E7 03E6 03E5 03E4 03E3 03E2 03E1 03E0 03DF 03DE 03DD 03DC 03DB 03DA 03D9 03D8
03D7 03D6 03D5 03D4 03D3 03D2 03D1 03D0 03CF 03CE 03CD 03CC 03CB 03CA 03C9 03C8
03C7 03C6 03C5 03C4 03C3 03C2 03C1 03C0 03BF 03BE 03BD 03BC 03BB 03BA 03B9 03B8
03B7 03B6 03B5 03B4 03B3 03B2 03B1 03B0 03AF 03AE 03AD 03AC 03AB 03AA 03A9 03A8
03A7 03A6 03A5 03A4 03A3 03A2 03A1 03A0 039F 039E 039D 039C 039B 039A 0399 0398
0397 0396 0395 0394 0393 0392 0391 0390 038F 038E 038D 038C 038B 038A 0389 0388

$A0880,
0387 0386 0385 0384 0383 0382 0381 0380 037F 037E 037D 037C 037B 037A 0379 0378
0377 0376 0375 0374 0373 0372 0371 0370 036F 036E 036D 036C 036B 036A 0369 0368
0367 0366 0365 0364 0363 0362 0361 0360 035F 035E 035D 035C 035B 035A 0359 0358
0357 0356 0355 0354 0353 0352 0351 0350 034F 034E 034D 034C 034B 034A 0349 0348
0347 0346 0345 0344 0343 0342 0341 0340 033F 033E 033D 033C 033B 033A 0339 0338
0337 0336 0335 0334 0333 0332 0331 0330 032F 032E 032D 032C 032B 032A 0329 0328
0327 0326 0325 0324 0323 0322 0321 0320 031F 031E 031D 031C 031B 031A 0319 0318
0317 0316 0315 0314 0313 0312 0311 0310 030F 030E 030D 030C 030B 030A 0309 0308

$A0900,
0307 0306 0305 0304 0303 0302 0301 0300 02FF 02FE 02FD 02FC 02FB 02FA 02F9 02F8
02F7 02F6 02F5 02F4 02F3 02F2 02F1 02F0 02EF 02EE 02ED 02EC 02EB 02EA 02E9 02E8
02E7 02E6 02E5 02E4 02E3 02E2 02E1 02E0 02DF 02DE 02DD 02DC 02DB 02DA 02D9 02D8
02D7 02D6 02D5 02D4 02D3 02D2 02D1 02D0 02CF 02CE 02CD 02CC 02CB 02CA 02C9 02C8
02C7 02C6 02C5 02C4 02C3 02C2 02C1 02C0 02BF 02BE 02BD 02BC 02BB 02BA 02B9 02B8
02B7 02B6 02B5 02B4 02B3 02B2 02B1 02B0 02AF 02AE 02AD 02AC 02AB 02AA 02A9 02A8
02A7 02A6 02A5 02A4 02A3 02A2 02A1 02A0 029F 029E 029D 029C 029B 029A 0299 0298
0297 0296 0295 0294 0293 0292 0291 0290 028F 028E 028D 028C 028B 028A 0289 0288

$A0980,
0287 0286 0285 0284 0283 0282 0281 0280 027F 027E 027D 027C 027B 027A 0279 0278
0277 0276 0275 0274 0273 0272 0271 0270 026F 026E 026D 026C 026B 026A 0269 0268
0267 0266 0265 0264 0263 0262 0261 0260 025F 025E 025D 025C 025B 025A 0259 0258
0257 0256 0255 0254 0253 0252 0251 0250 024F 024E 024D 024C 024B 024A 0249 0248
0247 0246 0245 0244 0243 0242 0241 0240 023F 023E 023D 023C 023B 023A 0239 0238
0237 0236 0235 0234 0233 0232 0231 0230 022F 022E 022D 022C 022B 022A 0229 0228
0227 0226 0225 0224 0223 0222 0221 0220 021F 021E 021D 021C 021B 021A 0219 0218
0217 0216 0215 0214 0213 0212 0211 0210 020F 020E 020D 020C 020B 020A 0209 0208

$A0A00,
0207 0206 0205 0204 0203 0202 0201 0200 01FF 01FE 01FD 01FC 01FB 01FA 01F9 01F8
01F7 01F6 01F5 01F4 01F3 01F2 01F1 01F0 01EF 01EE 01ED 01EC 01EB 01EA 01E9 01E8
01E7 01E6 01E5 01E4 01E3 01E2 01E1 01E0 01DF 01DE 01DD 01DC 01DB 01DA 01D9 01D8
01D7 01D6 01D5 01D4 01D3 01D2 01D1 01D0 01CF 01CE 01CD 01CC 01CB 01CA 01C9 01C8
01C7 01C6 01C5 01C4 01C3 01C2 01C1 01C0 01BF 01BE 01BD 01BC 01BB 01BA 01B9 01B8
01B7 01B6 01B5 01B4 01B3 01B2 01B1 01B0 01AF 01AE 01AD 01AC 01AB 01AA 01A9 01A8
01A7 01A6 01A5 01A4 01A3 01A2 01A1 01A0 019F 019E 019D 019C 019B 019A 0199 0198
0197 0196 0195 0194 0193 0192 0191 0190 018F 018E 018D 018C 018B 018A 0189 0188
0187 0186 0185 0184 0183 0182 0181 0180 017F 017E 017D 017C 017B 017A 0179 0178
0177 0176 0175 0174 0173 0172 0171 0170 016F 016E 016D 016C 016B 016A 0169 0168
0167 0166 0165 0164 0163 0162 0161 0160 015F 015E 015D 015C 015B 015A 0159 0158
0157 0156 0155 0154 0153 0152 0151 0150 014F 014E 014D 014C 014B 014A 0149 0148
0147 0146 0145 0144 0143 0142 0141 0140 013F 013E 013D 013C 013B 013A 0139 0138
0137 0136 0135 0134 0133 0132 0131 0130 012F 012E 012D 012C 012B 012A 0129 0128
0127 0126 0125 0124 0123 0122 0121 0120 011F 011E 011D 011C 011B 011A 0119 0118
0117 0116 0115 0114 0113 0112 0111 0110 010F 010E 010D 010C 010B 010A 0109 0108

$A0B00,
0107 0106 0105 0104 0103 0102 0101 0100 00FF 00FE 00FD 00FC 00FB 00FA 00F9 00F8
00F7 00F6 00F5 00F4 00F3 00F2 00F1 00F0 00EF 00EE 00ED 00EC 00EB 00EA 00E9 00E8
00E7 00E6 00E5 00E4 00E3 00E2 00E1 00E0 00DF 00DE 00DD 00DC 00DB 00DA 00D9 00D8
00D7 00D6 00D5 00D4 00D3 00D2 00D1 00D0 00CF 00CE 00CD 00CC 00CB 00CA 00C9 00C8
00C7 00C6 00C5 00C4 00C3 00C2 00C1 00C0 00BF 00BE 00BD 00BC 00BB 00BA 00B9 00B8
00B7 00B6 00B5 00B4 00B3 00B2 00B1 00B0 00AF 00AE 00AD 00AC 00AB 00AA 00A9 00A8
00A7 00A6 00A5 00A4 00A3 00A2 00A1 00A0 009F 009E 009D 009C 009B 009A 0099 0098
0097 0096 0095 0094 0093 0092 0091 0090 008F 008E 008D 008C 008B 008A 0089 0088

```
$A0B80,
0087 0086 0085 0084 0083 0082 0081 0080 007F 007E 007D 007C 007B 007A 0079 0078
0077 0076 0075 0074 0073 0072 0071 0070 006F 006E 006D 006C 006B 006A 0069 0068
0067 0066 0065 0064 0063 0062 0061 0060 005F 005E 005D 005C 005B 005A 0059 0058
0057 0056 0055 0054 0053 0052 0051 0050 004F 004E 004D 004C 004B 004A 0049 0048
0047 0046 0045 0044 0043 0042 0041 0040 003F 003E 003D 003C 003B 003A 0039 0038
0037 0036 0035 0034 0033 0032 0031 0030 002F 002E 002D 002C 002B 002A 0029 0028
0027 0026 0025 0024 0023 0022 0021 0020 001F 001E 001D 001C 001B 001A 0019 0018
0017 0016 0015 0014 0013 0012 0011 0010 000F 000E 000D 000C 000B 000A 0009 0008

$A0C00,
0007 0006 0005 0004 0003 0002 0001 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A0C80,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A0D00,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A0D80,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 [illegible]
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A0E80,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A0F00,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
```

```
0000 0000 0000 0000 0000 0000 0000 0000 0000 0000 0000 0000 0000 0000 0000 0000

$A0F80,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A1000,
0E9F 0E2E 05BD 054C 0BEB 0B7A 0E09 0A98 0A27 09B6 0945 08D4 0863 07F2 0781 0710
04DE 046A 03F9 0388 0317 02A6 0235 01C4 0153 00E2 0071 0000 0B93 0B12 05A1 0530
0BCF 0E5E 0AED 0A7C 0A0B 099A 0929 08B8 0847 07D6 0765 06F4 04BF 044E 03DD 03EC
02F6 028A 0219 01A8 0137 00C6 0055 0EEC 0B67 05F6 0585 0514 06E3 0842 0AD1 0A60
09EF 097E 090D 089C 082B 07BA 0749 06D8 04A3 0432 03C1 0350 02DF 026E 01FD 018C
011B 00AA 0039 0600 0645 05DA 0569 04FE 0E97 0826 0AB5 0A44 09D3 0962 08F1 0880
060F 079E 072D 06BC 0467 041E 03A5 0334 02C3 0252-01E1 0170 00FF 008E 001D 0E64
0E2F 05BE 054D 04DC 0B7B 080A 0A99 0A28 09E7 0946 08D5 0864 07F3 0782 0711 06A0

$A1080,
04EB 03FA 0389 0318 02A7 0236 01C5 0154 00E3 0072 0001 0E9E 0813 05A2 0531 04C0
065F 0AEE 0A7D 0A0C 099E 092A 08B9 0648 07D7 07E6 05F5 0584 044F 03DE 036D 02FC
028E 021A 01A9 0138 00C7 0056 0EED 0B7C 05F7 0586 0515 04A4 0E43 0AD2 0A61 09F0
097F 090E 089D 082C 07BB 074A 06D9 0668 0433 03C2 0351 02E0 026F 01FE 018D 011C
00AB 003A 0BD1 0B60 05DE 056A 04F9 0488 0E27 0A66 0A45 09D4 0963 08F2 0881 0810
079F 072E 06BD 064C 0417 03A6 0335 02C4 0253 01E2 0171 0100 005F 001E 0E55 0E44
05EF 054E 04DD 046C 0B0E 0A9A 0A29 09E8 0947 08D6 0865 07F4 0783 0712 06A1 0630
03FE 036A 0319 02A8 0237 01C6 0155 00E4 0073 0002 0E99 0B2E 05A3 0532 04C1 0450

$A1100,
0AEF 0A7E 0A0D 099C 092E 085A 0849 07D8 0767 06F6 0685 0614 03DF 036E 02FD 028C
0219 01AA 0139 00C8 0057 0BEE 0B7D 0B0C 0587 0516 04A5 0434 0AD3 0A62 09F1 098C
090F 089E 082D 07BC 074B 05DA 0669 05F8 03C3 0352 02E1 0270 01FF 018E 011D 00AC
003B 0BD2 0B61 0AF0 055B 04FA 0489 0418 0AB7 0A46 09D5 0964 08F3 0882 0811 07A0
072F 065E 064D 05DC 03A7 0336 02C5 0254 01E3 0172 0101 0090 001F 0EB6 0E45 0AD4
054F 04DE 046D 03FC 0A9B 0A2A 09B9 0948 08D7 0866 07F5 0784 0713 06A2 0631 05C0
03EE 021A 02A9 0138 01C7 0156 00E5 0074 0003 0E9A 0E29 04B8 0E33 0422 04E[illegible] 03EC
0A7F 0A0E 099D 092C 08BB 084A 07D9 0768 06F7 0686 0615 05A4 038F 02FE 028D 021C

$A1180,
01AB 013A 00C9 0058 [illegible]5F 0B7E 0B0D 0A9C 0517 04A6 0435 [illegible]C4 0A63 09F2 0981 0510
089F 082E 07BD 074C [illegible]B 066A 05F9 0588 0353 02E2 027[illegible] [illegible]00 018F 011E 00AD 003C
0BD3 0B62 0AF1 0A80 04FB 048A 0419 03A8 0A47 09D6 0965 08F4 0883 0812 07A1 0730
06BF 064E 05DD 056C 0337 02C6 0255 01E4 0173 0102 0091 0020 0BB7 0B46 0AD5 0A64
04DF 046E 03FD 038C 0A2B 09BA 0949 08D8 0867 07F6 0785 0714 06A3 0632 05C1 0550
0316 02AA 0239 01C8 0157 00E6 0075 0004 0E9B 0B2A 0AB9 0A48 04C3 0452 03E1 0370
0A0F 099E 092D 08BC 084B 07DA 0769 06F8 0687 0616 05A5 0534 02FF 028E 021D 01AC
013B 00CA 0059 0BF0 0B7F 0B0E 0A9D 0A2C 04A7 0436 03C5 0354 09F3 0982 0911 08A0

$A1200,
082F 07BE 074D 06DC 066B 05FA 0589 0516 02E3 0272 0201 0190 011F 00AE 003D 0BD4
0B63 0AF2 0A81 0A10 048B 041A 03A9 0338 09D7 0966 08F5 0884 0813 07A2 0731 05C0
0E4F 05DE 056D 04FC 02C7 0256 01E5 0174 0103 0092 0021 0BB8 0B47 0AD6 0A65 09F4
046F 03FE 038D 031C 09BB 094A 08D9 0868 07F7 0786 0715 06A4 0633 05C2 0551 04E0
02A6 023A 01C9 0158 00E7 0076 0005 0B9C 0B2B 0ABA 0A49 09D8 0453 03E2 0371 0300
095F 092E 08BD 084C 07DB 076A 06F9 0688 0E17 05A6 0535 04C4 028F 021E 01AD 013C
00CB 005A 0BF1 0B80 0B0F 0A9E 0A2D 09BC 0437 03C6 0355 02E4 0983 0912 08A1 0830
07BF 074E 06DD 066C 05FB 058A 0519 04A8 0273 0202 0191 0120 00AF 003E 0BD5 0B64

$A1280,
0AF3 0A82 0A11 09A0 041B 03AA 0339 02C8 0967 08F6 0885 0814 07A3 0732 06C1 0650
05DF 056E 04FD 048C 0257 01E6 0175 0104 0093 0022 0BB9 0B48 0AD7 0A66 09F5 0984
03FF 038E 031D 02AC 094B 08DA 0869 07F8 0787 0716 06A5 0634 05C3 0552 04E1 0470
023B 01CA 0159 00E8 0077 0006 0B9D 0B2C 0ABB 0A4A 09D9 0968 03E3 0372 0301 0290
092F 08BE 084D 07DC 076B 06FA 0689 0618 05A7 0536 04C5 0454 021F 01AE 013D 00CC
005B 0BF2 0B81 0B10 0A9F 0A2E 09BD 094C 03C7 0356 02E5 0274 0913 08A2 0831 07C0
074F 06DE 066D 05FC 058B 051A 04A9 0438 0203 0192 0121 0080 003F 0BD6 0B65 0AF4
0A83 0A12 09A1 0930 03AB 033A 02C9 0258 08F7 0886 0815 07A4 0733 06C2 0651 05E0

$A1300,
056F 04FE 048D 041C 01E7 0176 0105 0094 0023 0BBA 0B49 0AD8 0A67 09F6 0985 0914
036F 031E 02AD 023C 08DB 086A 07F9 0788 0717 06A6 0635-05C4 0553 04E2 0471 0400
01CB 015A 00E9 0078 0007 0B9E 0B2D 0ABC 0A4B 09DA 0969 08F8 0373 0302 0291 0220
06BF 064E 07DD 076C 06FB 068A 0619 05A8 0537 04C6 0455-03E4 01AF 013E 00CD 005C
```

```
0EF3 0B82 0E11 0AA0 0A2F 09EE 094D 090C 0357 02EE 0275 0204 0EA3 0832 07C1 0750
06DF 066E 05FD 056C 051E 04AA 0439 0308 0193 0122 0081 0040 0ED7 0B6E 0AF8 0AB4
0A13 09A2 0931 08C0 035B 0CCA 0259 01EE 0987 0916 07A6 0734 0603 0652 05E1 0570
04FF 046E 041D 03AC 0177 010E 0095 0024 0EBB 084A 0AD9 0A69 09F7 0986 0915 08A4

$A1380,
031F 02AE 0230 01CC 0866 07FA 0769 0719 0EA7 0636 0505 0554 04E6 0472 0401 0390
015B 00EA 0079 0008 0B9F 0E2E 0ABD 0A4C 09DB 096A 05F9 068B 0303 0292 0221 01E0
094F 07DE 076D 06FC 066E 061A 05A9 0539 04C7 045E 03E5 0374 013F 00CE 0250 0EF4
0EE3 0E12 0AA1 0A30 096F 094E 05DD 086C 02E7 027B 0205 0194 0933 07C2 0751 06E0
0EEF 05FE 056D 051C 04AB 043A 03C9 0359 0123 00B2 0041 09DB 0EE7 0AF6 0A6B 0A14
09A3 0932 08C1 0850 02C6 025A 01E9 017B 0917 07A6 0735 0604 0553 05E2 0571 0500
045F 041E 03AD 033C 01C7 0095 0025 0EBC 0E4B 0ADA 0A69 09F8 0987 0916 06A6 0E34
02AF 023E 01CD 015C 07FB 078A 0719 06A9 0637 05CE 0555 04E4 0473 0402 0351 0320

$A1400,
00EE 007A 0009 0BAC 06CF 0AEB 0A4D 090C 096B 05FA 0688 0319 0293 0222 01E1 0140
07DF 076E 06FD 063C 061B 05AA 0539 04CB 04B7 03EE 0375 0304 00CF 005E 0EFB 0EB4
0E13 0AA2 0A31 09C0 054F 06DE 0E5D 07FC 0277 0205 0195 0124 07C3 0752 06E1 0670
0EFF 0E5E 0E1D 04AC 043B 03CA 0359 02E8 00E3 0042 0EC3 0B5B 0AF7 0A6B 0A1E 09A4
0933 08C2 0851 07E2 025E 01EA 0179 0108 07A7 0735 0554 05E3 0572 0501 0450
041F 03AE 033D 02CC 0097 00E6 0EED 0E4C 0ADB 0A6A 05F9 08E8 0817 06AB 06E6 07C4
023F 01CE 01ED 00EC 07EE 071A 06AA 0638 05C7 0555 04EB 0474 0403 0352 02D1 0250
00FE 000A 0BA1 0B30 0AEF 0A4E 09DD 0560 05FE 0EEA 0619 07A6 0223 01E2 0141 0000

$A1480,
07EF 0BFE 0BED 0B1C 0EAE 0E3A 04CB 049B 03E7 037E 02D5 0294 005F 0BFE 0B55 0E14
0AA2 0A31 09C1 095C 08DF 0EEB 07FC 076C 0237 0195 0128 0EC4 0753 06E1 0871 0000
095F 051E 04AC 0430 03CE 02BA 0DE8 0778 0242 0EDA 0EBB 0AF8 0A67 0A1B 09AB 0834
09C3 0BEC 07E1 077C 01EB 017A 01CE 0253 0707 0BCE 0B5E 0B54 0E73 05C2 04B1 0430
02AF 023E 01CD 0ABC 00C7 08EE 0E4D 0A11 0ABB 0BFA 0B3B 021B 02A7 0275 0275 0024
01CF 015E 002D 02D1 02E1 06AA 0673 0E11 0B5F 0AEB 0AFE 0ADA 09DD 0965 0361 0340
1333 0BAD 0E21 0A11 0A4F 0ECC 0BBC 0AF0 0B5D 0CC3 0988 052A 0853 072D 0AB1 0000
0AFE 0ABE 081C 00A8 097E 0A17 0ABB 07C7 0005 0888 0008 0BFF 0255 07B3 001B

$A1500,
                            _____                  _____
0A33 09C2 0951 |08F   386F |07FE 078D 071C 0197 0126 |0F        |0044 06E3 0672 0601 0590
051F 04AE 0430 |03.   035B |02EA 0279 0208 0BDB 086A |0A        |0A88 0A17 09A6 0935 08C4
                ‾‾‾‾‾‾‾‾‾                            ‾‾‾‾‾‾‾‾‾
0653 07E2 0771 0700 017B 010A 0099 0028 06C7 0656 05E5 0574 0503 0492 0421 0350
033F 02CE 025D 01EC 0BBF 0B4E 0ADD 0A6C 09FB 098A 0919 08A8 0837 07C6 0755 06E4
015F 00EE 007D 000C 06AB 063A 05C9 0558 04E7 0476 0405 0394 0323 02B2 0241 01DC
06A3 0B32 0AC1 0A50 09DF 096E 08FD 088C 081B 07AA 0739 06C8 0143 00D2 0061 0BF8
066F 061E 05AD 053C 04CB 045A 03E9 0378 0307 0296 0225 01B4 0BB7 0B16 0AA5 0A34
09C3 0952 08E1 0870 07FF 078E 071D 06AC 0127 00B6 0045 0BDC 0673 0602 0591 0520

$A1580,
04AF 043E 03CD 035C 02EB 027A 0209 0198 0B66 0AFA 0A89 0A16 09A7 0936 08C5 0BE4
07E3 0772 0701 0690 0106 009A 0029 0BC0 0657 05E6 0575 0504 0493 0422 03B1 0340
02CF 025E 01ED 017C 0B4F 0ADE 0A6D 09FC 098B 091A 08A9 0838 07C7 0756 06E5 0674
00EF 007E 000D 0BA4 063B 05CA 0559 04E8 0477 0406 0395 0324 02B3 0242 01D1 0160
0B33 0AC2 0A51 09E0 096F 08FE 088D 081C 07AB 073A 06C9 0658 00D3 0062 0BF9 0B68
061F 05AE 053D 04CC 045B 03EA 0379 0308 0297 0226 01B5 0144 0B17 0AA6 0A35 09C4
0953 08E2 0871 0800 076F 071E 06AD 063C 00B7 0046 0BDD 086C 0603 0592 05D1 04E0
043F 03CE 035D 02EC 027B 020A 0199 0128 0AFB 0A8A 0A19 09A2 0937 08C6 0B55 07E4

$A1600,
0773 0702 0691 0620 009B 002A 0BC1 0B50 05E7 0576 0505 0494 0423 03B2 0341 0200
025F 01EE 017D 010C 0ADF 0A6E 09FD 098C 091B 08AA 0639 07C8 0757 06E6 0675 06C4
007F 000E 0BA5 0B34 05CB 055A 04E9 0478 0407 0396 0325 02B4 0243 01D2 01E1 00F0
0AC3 0A52 09E1 0970 06FF 086E 081D 07AC 073B 06CA 0659 05E8 00E3 0BFA 0B29 0B16
05AF 053E 04CD 045C 03EB 037A 0309 0298 0227 01B6 0145 00D4 0AA7 0A36 09C5 0954
06E3 0872 0801 0790 071F 05AE 063D 05CC 0047 0BDE 086D 0AFC 0593 0522 04E1 0440
03CF 035E 02ED 027C 020B 019A 0129 00B8 0AEB 0A1A 09A9 0938 08C7 0856 07E5 0774
0703 0692 0621 05B0 002B 0BC2 0B51 0AE0 0577 0506 0495 0424 03B3 0342 02D1 02E0

$A1680,
01EF 017E 010D 009C 0A6F 09FE 098D 091C 0BAE 023A 07C9 0758 06E7 0E7E 05C5 05B4
00CF 0BA6 0B35 0AC4 055E 04EA 0479 0408 0397 0326 02B5 0244 01D3 0162 00F1 00C0
0A53 09E2 0971 0900 08BF 08IE 07AD 073C 06CB 265A 05E9 0578 06FE 0E5A 0E19 0AAB
053F 04CE 045D 03EC 037B 030A 0299 0228 01B7 0146 00D5 0064 0A37 09C6 0555 0EE4
0873 0802 0791 0720 06AF 063E 05CD 055C 0BDF 086E 0AFD 0720 0AEC 0E23 0441 0230
035F 02EE 027D 020C 019E 012A 0089 0048 0A1B 09AA 0939 08C8 0857 07E6 0775 0704
0E93 0E22 0581 0540 06C3 0B52 0AE1 0A70 0507 0496 0425 03B4 0343 02D2 02E1 01F0
017F 010E 009D 002C 09FF 098E 091D 08AC 063B 07CA 0759 06E8 0677 0606 0555 0524

$A1700,
0BA7 0E3E 0AC5 0A54 04EB 047A 0405 0398 0327 02E5 0245 01D4 0163 00F2 0061 0010
```

```
0953 0972 0901 0890 061F 07AE 073D 06CC 0659 05EA 0575 0508 0528 051A 0AA9 0A39
04CF 045E 03ED 037C 030B 025A 0229 01B8 0147 00D6 0065 0EFC 09C7 095B 0285 0274
0503 0792 0721 06B0 063F 05CE 055D 04EC 0EEF 0AFE 0A8D 0A1C 04EB 0442 0321 03B0
0EEF 027E 020D 019C 012B 00BA 0049 0BE0 09AB 093A 08C9 0858 07E7 0776 0705 0594
0523 05B2 0541 04D0 0B53 0AE2 0671 0A00 0497 0426 03B5 0344 02D3 0262 01F1 0180
010F 009E 002D 0EC4 0B6F 091E 09AD 093C 07CB 075A 06E9 0678 0607 0595 0525 04B4
0E37 0AC6 0A55 09E4 0476 040A 0399 0328 02B7 0246 01D5 0164 00F3 0082 0011 0BA8

$A1780,
0973 0902 0891 08B0 07AF 073E 06CD 065C 05EB 057A 05C9 0498 0B1B 0AAA 0A39 0BC8
045F 03EE 037D 030C 029B 022A 01B9 0148 00D7 0066 0BFD 0B8C 0957 08B5 0875 0264
0793 0722 06B1 0640 05CF 055E 04ED 047C 0AFF 0A8E 0A1D 09AC 0443 03D2 0351 02F0
027F 020E 019D 012C 00BB 004A 06E1 0B70 093E 05CA 0655 07E8 0777 0706 0595 0524
0553 0542 04D1 0460 0AE3 0A72 0A01 0990 0427 03B6 0345 02D4 0263 01F2 0131 0110
005F 002E 0BC5 091F 03AE 083D 07CC 075B 06EA 0679 0508 0597 0526 04B5 0444
0AC7 0A56 09E5 0974 040B 039A 0329 02B8 0247 01D6 0165 02F4 0083 0012 0BA9 0B38
0903 0892 0821 07B0 073F 06CE 065D 05EC 057B 050A 0499 0428 0AAB 0A3A 09C9 0958

$A1800,
03EF 037E 030D 029C 022B 01BA 0149 00D8 0267 06FE 0B8D 091C 08E7 0876 0805 0794
07B3 06B2 0541 05D0 055F 04EE 047D 040C 0ABF 0A4E 09AD 093C 0953 03D3 03F1 03E0
02DF 019E 012D 00BC 004B 03EC 0BE7 0B8C 0E8B 095A 07E9 0779 0707 0656 0265 0524
0543 04D2 0461 03F0 0A73 0A02 0991 0E2C 03B7 0345 02D5 0264 01F3 0182 0111 02A0
022F 00C5 0B55 04E4 0BAF 093E 07CD 06FC 07EC 06EA 0509 0598 0527 04B6 0445 0334
0A58 09E6 0975 0894 033B 02BA 0E49 01C7 01B6 02FE 0094 0DC7 06AA 06B3 0A3B 0A38
0A97 0A26 07B5 0740 06CF 065E 05ED 057C 050B 049A 0429 0AB8 0A3D 09C9 0958 05E8
----- ---- ---- ---- ---- ---- ---- ----- ---- ---- ---- ---- ---- ---- ---- ----
071F 03CE 0250 0DDE 014A 0DD9 0DE6-DFF 03EE 06ED 0AAA 0F77 09D8 0FBE 0FD4

$A1860,
        0663 0642 05D1 0560 [  7F] 047E 040D 039C 0A1F 09AE 093D [ CC] 0363 02F2 0261 0210
04EF    019F 012E 00BD 004C [  3 ] 0872 0B01 0A90 0B5B 07EA 0779 [ .B] 0697 0626 05B5 0544     05CC
0BE3    04D3 0462 03F1 0380 0A03 0992 0921 08B0 0347 02D6 0265 01F4 0183 0112 00A1 0030          0708
BH      0BC7 0B56 0AE5 0A74 083F 07CE 075D 06EC 0678 060A 0599 0528 04B7 0446 03D5 0364
        09E7 0976 0905 0894 032B 02BA 0249 01D8 0167 00F6 0085 0014 0BAB 0B3A 0AC9 0A58
        0823 07B2 0741 06D0 065F 05EE 057D 050C 049B 042A 03B9 0348 09CB 095A 08E9 0878
        030F 029E 022D 01BC 014B 00DA 0069 0C00 0B8F 0B1E 0AAD 0A3C 0807 0796 0725 06B4
        0643 05D2 0561 04F0 047F 040E 039D 032C 09AF 093E 08CD 085C 02F3 0282 0211 01A0

$A1900,
012F 00BE 004D 0BE4 0B73 0B02 0A91 0A20 07EB 077A 0709 0698 0627 05B6 0545 04D4
0463 03F2 0381 0310 0993 0922 08B1 0840 02D7 0266 01F5 0184 0113 00A2 0031 0BC8
0B57 0AE6 0A75 0A04 07CF 075E 06ED 067C 060B 059A 0529 04B8 0447 03D6 0365 02F4
0977 0906 0895 0824 02BB 024A 01D9 0168 00F7 0086 0015 0BAC 0B3B 0ACA 0A59 09E8
07B3 0742 06D1 0660 05EF 057E 050D 049C 042B 03BA 0349 02D8 095B 08EA 0879 080B
029F 022E 01BD 014C 00DB 006A 0C01 0B90 0B1F 0AAE 0A3D 09CC 0797 0726 06B5 0644
05D3 0562 04F1 0480 040F 039E 032D 02BC 093F 08CE 085D 07EC 0283 0212 01A1 0130
06BF 004E 0BE5 0B74 0B03 0A92 0A21 0960 077B 070A 0699 0628 05B7 0546 04D5 0464

$A1960,
03F3 0382 0311 02A0 0923 08B2 0841 07D0 0267 01F6 0185 0114 00A3 0032 0BC9 0B58
0AE7 0A76 0A05 0994 075F 06EE 067D 060C 059B 052A 04B9 0448 03D7 0366 02F5 0284
09D7 0B96 0B25 07B4 024B 01DA 0169 00F8 0087 0016 0BAD 0B3C 0ACB 0A5A 09E9 0978
0743 06D2 0661 05F0 057F 050E 049D 042C 03BB 034A 02D9 0268 08EB 067A 0809 0798
022F 01EE 014D 00DC 006B 0C02 0B91 0B20 0AAF 0A3E 09CD 095C 0727 06B6 0645 05D4
0563 04F2 0481 0410 039F 032E 02BD 024C 08CF 085E 07ED 077C 0213 01A2 0131 00C0
004F 0BE5 0B75 0B04 0A93 0A22 0961 0940 070B 069A 0629 05B8 0547 04D6 0465 03F4
0383 0312 02A1 0230 08B3 0842 07D1 0760 01F7 0186 0115 00A4 0033 0BCA 0B59 0AE8

$A1AC0,
0A77 0A05 0995 0924 06EF 067E 060D 059C 052B 04BA 0449 03D8 0367 02F6 0285 0214
09D7 0826 07B5 0744 01DB 016A 00F9 0088 0017 0BAE 0B3D 0ACC 0A5B 09EA 0979 0908
06D3 0662 05F1 0580 050F 049E 042D 03BC 034B 02DA 0269 01F8 0875 08BA 07E9 0728
01BF 014E 00DD 006C 0C03 0B92 0B21 0A60 0A3F 09CE 095D 08EC 0657 06B6 05D5 0564
04F3 0482 0411 03A0 032F 02BE 024D 01DC 085F 07EE 077D 070C 01A3 0132 00C1 0050
0BE7 0B76 0B05 0A94 0A23 0962 0941 08D0 08D8 069B 062A 05B9 0548 04D7 0466 03F5 0384
0313 02A2 0231 01C0 0843 07D2 0761 06F0 0187 0116 00A5 0034 0BCB 0B5A 0AE9 0A78
0A07 0996 0925 08B4 067F 060E 059D 052C 04BB 044A 03D9 0368 02F7 0286 0215 01A4

$A1AC0,
0827 07B6 0745 06D4 016B 00FA 0089 0C18 0BAF 0B3E 0ACD 0A5C 09EB 097A 0909 0898
0663 05F2 0581 0510 049F 042E 03BD 034C 02DB 026A 01F9 0188 08B6 079A 0729 06B8
014F 00DE 006D 0C04 0B93 0B22 0AE1 0A40 09CF 095E 0EED 067C 0647 05D6 0565 04F4
04B3 0412 03A1 0330 02BF 024E 01DD 016C 07EF 077E 070D 069C 0133 00C2 0051 0BE8
0B77 0B06 0A95 0A24 0963 0942 08D1 0860 062B 05BA 0549 04D8 0467 03F6 0385 0314
02A3 0232 01C1 0150 07D3 0762 06F1 0680 0117 00A6 0035 0BCC 0B5B 0AEA 0A79 0A08
0997 0926 08B5 0844 06CF 059E 052D 04BC 044B 03DA 0369 02F8 0287 0216 01A5 0134
07E7 0746 06D5 0664 00FB 008A 0019 0EB0 0B3F 0ACE 0A5D 09EC 097B 090A 0899 082B
```

```
$A1E00,
05F3 0582 0511 04A0 042F 039E 034D 02DC 02EE 01FA 0189 0118 0795 072A 06E9 0648
00DF 00EE 0C05 0B94 0B23 0AB2 0A41 09D0 095F 08EE 087D 080C 0507 0566 04F5 0484
0413 03A2 0331 02C0 024F 01DE 016D 00FC 077F 070E 069D 062C 0003 0052 0EE9 0E78
0607 0A96 0A25 09B4 0943 08D2 0861 07F0 058B 054A 04D9 0468 03F7 0386 0315 02A4
0233 01C2 0151 00E0 0763 06F2 0681 051C 00A7 0036 0BCD 0B5C 0AEE 0A7A 0A09 0998
0527 0866 0545 07D4 055F 052E 04ED 044C 03DE 036A 02F9 0288 0217 01A6 0135 00C4
0747 06DE 0665 05F4 008E 001A 0EE1 0E40 0ACF 0A5E 09ED 097C 0906 089A 0829 07B6
0583 0512 04A1 0430 03BF 034E 02DD 026C 01FB 018A 0119 00A8 0726 06BA 0645 05D2

$A1E82,
006F 0008 0E95 0E24 0AE3 0A42 0901 0980 08EF 087E 080D 0790 0557 04F6 0485 0414
03A3 0332 0201 0250 010F 015E 00FD 0080 070F 069E 062D 055C 0053 0BEA 0E78 0E08
0A97 0A28 0985 0944 08D3 0882 07F1 0780 054E 040A 0465 03FE 0387 0316 02A5 0234
0103 0152 00E1 0070 06F3 0EE2 0511 05A0 0037 0E0E 0E5D 0AEC 0A7E 0A04 0999 0928
08E7 0846 07DE 0764 052F 04EE 0442 0302 02BE 02FA 0299 0212 01A7 0136 00CE 0054
0E07 0EEE 05FE 0594 001E 0EE2 0E41 0A0C 0AEF 0EEE 0970 0902 0898 0E2A 07EB 0748
0512 0442 0421 0310 034F 022E 0120 01F0 01EE 011A 0045 0073 0EEE 0E44 0E2E 0EEE
0107 0E9E 0E2B 0AE4 0A42 0977 0981 08F0 087F 030E 07B2 0722 04F7 0488 041E 0344

$A1C00,
0333 02C2 0251 01E0 [illegible]6F 00FE 008D 001C 0000 0000 000[illegible] [illegible]00 0000 0000 0000 0000
0000 0000 0000 000[illegible] [illegible]00 0000 0000 0000 0000 0000 000[illegible] [illegible]00 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A1C80,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A1D00,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A1D80,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A1E00,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A1E80,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
```

```
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000

$A1F00,
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0000 0000 0000 0000 0000 0000 0000 0000
0000 0000 0000 0000 0000 0000 0000 0000 0
0000 0000 0000 0000 0000 0000 0000 0000 0
0000 0000 0000 0000 0000 0000 0000 0000 0
0000 0000 0000 0000 0000 0000 0000 0000 0
0000 0000 0000 0000 0000 0000 0000 0000 0
0000 0000 0000 0000 0000 0000 0000 0000 0
0000 0000 0000 0000 0000 0000 0000 0000 0
0000 0000 0000 0000 0000 0000 0000 0000 0
```

APPENDIX C

COPYRIGHT 1990 Eastman Kodak Company

```
$A0000,
3F 3E 3D 3C 3B 3A 39 38 [illegible] 36 35 34 33 32 31 30
2F 2E 2D 2C 2B 2A 29 28 [illegible] 26 25 24 23 22 21 20
1F 1E 1D 1C 1B 1A 19 18 17 16 15 14 13 12 11 10
0F 0E 0D 0C 0B 0A 09 08 07 06 05 04 03 02 01 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00

$A0080,
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00

$A0100,
3F 1E 3D 1C 3B 1A 39 18 37 16 35 14 33 12 31 10
2F 0E 2D 0C 2B 0A 29 08 27 06 25 04 23 02 21 00
1F 3E 1D 3C 1B 3A 19 38 17 36 15 34 13 32 11 30
0F 2E 0D 2C 0B 2A 09 28 07 26 05 24 03 22 01 20
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00

$A0180,
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
00 00 00 00 00 00 00 00 00 00 00 00 00 00 00 00
 $50FC0,
```

What is claimed is:

1. A serial shift encoder for generating parity characters having intermediate symbol locations between first and second message blocks in a codeword of a code generator polynomial g(x), comprising: first means for generating first products of a successive character of the first measage block multiplied by corresponding coefficients of g(x);

second means for generating second products of a successive character of the second message block multiplied by corresponding coefficients of a remainder h(x) of the division by g(x) an algebraic shift factor $x^n$; and third means comprising a series of adders, a first of said series of adders for generating a sum of (a) a preselected one of said first products and (b) a preselected one of said second products, a remainder of said series of adders for generating in a corresponding one of said adders the sum of (a) the contents of a previous one of said adders, (b) a respective one of said first products and (c) a respective one of said second products, said third means serially shifting the sum generated in each adder to a succeeding adder in said series.

2. The encoder of claim 1 wherein the degree n of said algebraic shift factor $x^n$ is equal to a length of a cyclic error correction code minus a length of a right-hand message block.

3. The encoder of claim 1 wherein said first and said second products summed in successive ones of said adders correspond to coefficients of g(x) and h(x) of successively higher powers of x.

4. The encoder of claim 3 wherein said first and second message blocks are the higher and lower order coefficients, respectively, of a codeword polynomial, said encoder further comprising:

means for multiplying said successive character of said first message block by a second algebraic shift factor $x^m$ of degree m equal to the number of parity character locations between said first and second message blocks in said codeword.

5. The encoder of claim 4 wherein said means for multiplying said successive character of said first message block by said second shift factor comprises means for adding to said successive character of said first message block the contents of an adder in said series of adders corresponding to the highest degree of x.

6. The encoder of claim 5 wherein the highest order coefficient of g(x) corresponding to a highest order adder is unity and said respective coefficient of h(x) corresponding to said highest order adder is zero.

7. The encoder of claim 6 wherein said successive characters of said first message block are transmitted directly to said highest order adder without multiplication and said successive characters of said second message block are not coupled to said highest order adder.

8. A serial interleaving and encoding system, comprising:

(I) an outer serial shift encoder for generating parity characters having intermediate symbol locations between first and second message blocks in a codeword of a code generator polynomial g(x), comprising:

(A) first means for generating first products of a successive character of the first message block multiplied by corresponding coefficients of g(x), (B) second means for generating second products of a successive character of the second message block multiplied by corresponding coefficients of a remainder h(x) of the division by g(x) of an algebraic shift factor $x^n$, (C) third means comprising a series of adders for generating in a corresponding one of said adders the sum of (a) the contents of a previous one of said adders, (b) a respective one of said first products and (c) a respective one of said second products, and serially shifting the sum generated in each adder to a succeeding adder in said series;

(D) fourth means for serially sending all of the characters of said first and second message blocks to said first and second means, respectively, and to an encoder output node and then shifting the current sums in said adders to said encoder output node;

(II) a first serial interleaver having an input and an output, said first serial interleaver comprising:

(A) random access memory for writing characters received at said input into memory locations and for reading characters from said memory locations to said output;

(B) up-counter unit for specifying an ordered sequence of said memory locations during one of reading and writing of said characters in said random access memory;

(C) read-only memory for specifying a scrambled sequence of said memory locations during the other of said reading and writing of said characters in said random access memory; and (III) an inner serial encoder for encoding a block of characters received from said output of said first serial interleaver, wherein said first serial interleaver input is connected to an output node of said inner encoder.

9. The interleaving and encoding system of claim 8 wherein said fourth means further comprises means for disabling said first and second means simultaneously with said shifting of the contents of said adders to said inner encoder output node.

10. A method for generating parity characters having intermediate symbol locations between first and second message blocks in a codeword of a code generator polynomial g(x), comprising:

first generating first products of a successive character of the first message block multiplied by corresponding coefficients of g(x);

second generating second products of a successive character of the second message block multiplied by corresponding coefficients of a remainder h(x) of the division by g(x) of an algebraic shift factor $x^n$;

third generating in a corresponding one of a series of adders the sum of (a) a respective one of said first products and (b) a respective one of said second products, wherein the sum of each of said adders following a first of said series of adders includes the contents of a previous one of said series of adders; and serially shifting the sum generated in each adders to a succeeding adder in said series.

11. The method of claim 10 wherein a degree n of said algebraic shift factor $x^n$ is equal to a length of the cyclic error correction code minus a length of a right-hand message block.

12. The method of claim 10 wherein said first and second products summed in successive ones of said adders correspond to coefficients of g(x) and h(x) of successively higher powers of x.

13. The encoder of claim 12 wherein said first and second message blocks are the higher and lower order coefficients, respectively, of a codeword polynomial, said method further comprising:

multiplying said successive character of said first message block by a second algebraic shift factor $x^m$ of degree m equal to the number of parity character locations between said first and second message blocks in said codeword.

14. The method of claim 13 wherein said step of multiplying said successive character of said first message block by said second shift factor comprises adding to said successive character of said first message block the contents of a highest order adder in said series of adders corresponding to the highest degree of x.

15. The method of claim 14 wherein the highest order coefficient of g(x) corresponding to said highest order adder is unity and said respective coefficient of h(x) corresponding to said highest order adder is zero.

16. The method of claim 15 wherein said first generating step comprises transmitting the characters of said first message block directly to said highest order adder without multiplication and wherein said second generating step comprises isolating said highest order adder from the characters of said second message block.

* * * * *